United States Patent
Wyers et al.

(10) Patent No.: US 7,119,611 B2
(45) Date of Patent: Oct. 10, 2006

(54) ON-CHIP CALIBRATED SOURCE TERMINATION FOR VOLTAGE MODE DRIVER AND METHOD OF CALIBRATION THEREOF

(75) Inventors: Eric James Wyers, Austin, TX (US); Dan Stiurca, Austin, TX (US); John James Paulos, Austin, TX (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 10/411,993

(22) Filed: Apr. 11, 2003

(65) Prior Publication Data
US 2004/0201416 A1 Oct. 14, 2004

(51) Int. Cl.
*G01R 19/00* (2006.01)
*H03F 3/26* (2006.01)
(52) U.S. Cl. .......................... 330/2; 330/255; 330/260; 330/265
(58) Field of Classification Search ...................... None
See application file for complete search history.

(56) References Cited

U.S. PATENT DOCUMENTS

| 5,121,080 | A | * | 6/1992 | Scott et al. | 330/260 |
| 5,585,763 | A | * | 12/1996 | Navabi et al. | 330/260 |
| 5,621,357 | A | * | 4/1997 | Botti et al. | 330/260 |
| 6,343,024 | B1 | * | 1/2002 | Zabroda | 363/22 |
| 6,724,219 | B1 | * | 4/2004 | Kim et al. | 326/30 |

* cited by examiner

*Primary Examiner*—Khanh Van Nguyen
(74) *Attorney, Agent, or Firm*—Christie, Parker & Hale, LLP

(57) ABSTRACT

On-chip calibrated source termination for voltage mode driver. An amplifier is disclosed having an internal amplifier with a first output and a second output, the first output interfaced to a non-inverting input through an interface. The second output is coupled to the first output through a series resistance element. The output impedance of the amplifier is determined by the ratio of the current drive of the first and second outputs. The voltage on said second output being a function of said interface and the current input to said internal amplifier.

81 Claims, 12 Drawing Sheets

ON-CHIP CALIBRATED SOURCE TERMINATION FOR VOLTAGE MODE DRIVER AND METHOD OF CALIBRATION THEREOF

CROSS-REFERENCE TO RELATED APPLICATIONS

This application is related to U.S. patent application Ser. No. 09/894,388, filed Jun. 28, 2001, and entitled "OUTPUT DRIVER FOR HIGH SPEED ETHERNET TRANSCEIVER," which is incorporated herein by reference.

TECHNICAL FIELD OF THE INVENTION

The present application pertains in general to line drivers and, more particularly to a voltage mode line driver for an integrated circuit having associated therewith a calibrated output impedance, and the calibration engine associated therewith.

BACKGROUND OF THE INVENTION

When sending signals over transmission lines, it is often necessary to match the characteristic impedance of the line at the signal source in order to avoid reflections and ringing in the transmission line. Transmission line impedances in the range of 50 to 200 Ohms are commonly utilized. Additionally, transformers with different turn ratios are often needed, which can result in a wide range of reflected line impedances to be matched by the signal source, which signal source typically drives the transmission line with a line driver. The line driver can have a very low impedance associated therewith, thus requiring an external matching resistor, or it can incorporate therein an internal impedance that provides an output impedance that matches the transmission line impedance.

One approach to driving the transmission line with a line driver is to match the impedance of the line driver driving the line with either an ideally zero impedance amplifier in series with a resistor or an ideally infinite impedance amplifier in parallel with a resistor. This approach has a disadvantage of a substantial increase in the power consumption due to power dissipated by the added resistor. The alternative is to design an amplifier with a finite output impedance equal to the characteristic impedance of the transmission line. To be able to use such an amplifier with different transmission lines or transformers, its output impedance should be programmable.

SUMMARY OF THE INVENTION

The present invention disclosed and claimed herein, in one aspect thereof, comprises an amplifier with an internal amplifier having a first output and a second output, the first output interfaced to a non-inverting input through an interface element. The second output is coupled to the first output through a series resistance element. The output impedance of the amplifier is determined by the ratio of the current drive to the first and second outputs. The voltage on the second output is a function of the interface element and current input to the internal amplifier.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
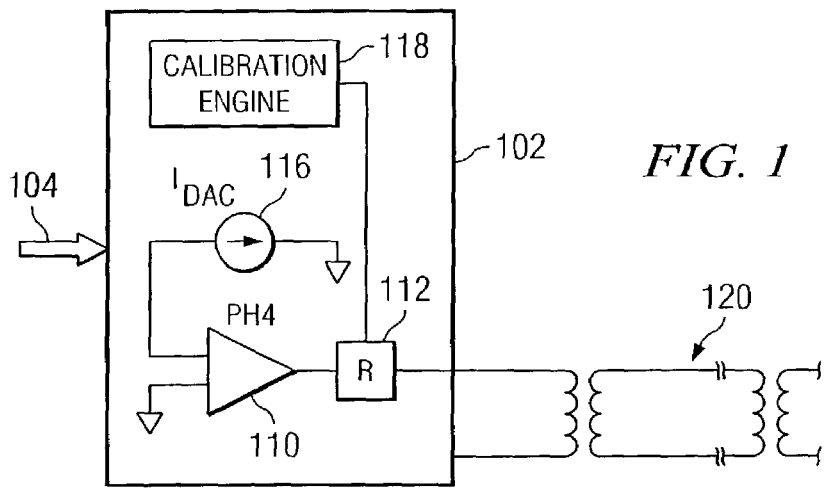
FIG. 1 illustrates an overall diagrammatic view of the line driver of the present disclosure with a calibrated impedance in an integrated circuit.

Referring now to FIG. 1, there is illustrated a diagrammatic view of the output impedance calibrated line driver of the present disclosure. In the present disclosed embodiment, the line driver is associated with an ethernet device which incorporates a PHY 102 disposed between a transmission line and other circuitry such as a media access controller (MAC). The other circuitry is interface with through signal lines 104. The line driver is illustrated as being disposed in the PHY 102 for driving a transmission line 120. However, it should be understood that the line driver could drive any type of transmission line that requires a matching impedance associated therewith. The value of the transmission line impedance is approximately 100 Ohms, although it could be any impedance value.

Internal to the PHY, there is provided a line driver 110 that has the output thereof connected to an internal impedance 112, which is a calibratable impedance. The line driver 110 is driven with a current 116 that is derived from a digital-to-analog converter (DAC), this being the DAC current, $I_{DAC}$. Note that this is illustrated as a single ended driver, wherein a differential drive may be implemented, as will be described hereinbelow. A separate calibration engine 118 is provided that is operable to calibrate the value of the impedance 112 to account for such things as process variations between the integrated circuits. The calibration engine 118 is initiated in response to a power up operation, such that, when the integrated circuit is initialized at power up, a calibration routine is initiated. However, the calibration operation could be in response to any appropriate signal and could be a periodic calibration operation that would be generated at periodic intervals to recalibrate the output impedance.

Figure 2:
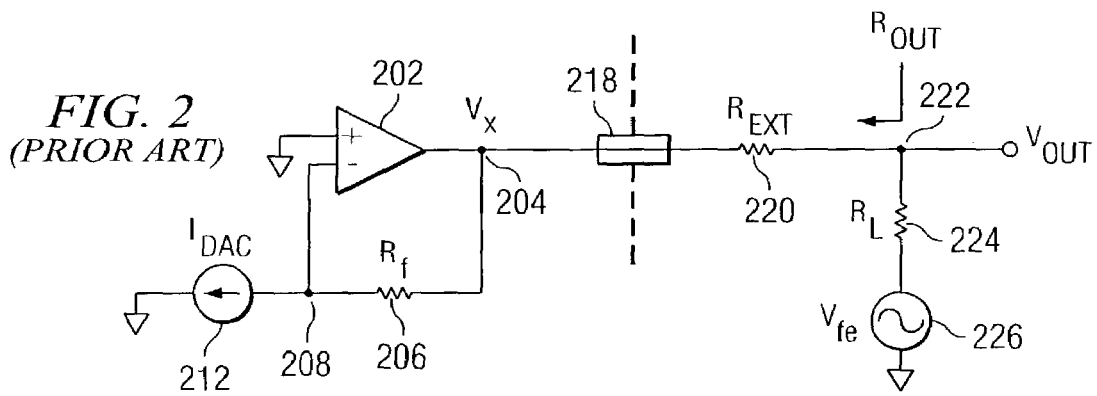
FIGS. 2–4 illustrate prior art line drivers.

Referring now to FIG. 2, there is illustrated schematic diagram of a prior art low impedance line driver. An amplifier 202 is provided having a positive input connected to ground or a common mode voltage. (For the purpose of this disclosure, amplifiers will have one input thereof connected to ground, which it should be understood could be a common mode voltage level.) The output of the amplifier 202 is connected to a node 204, which node 204 is connected through a feedback resistor 206, $R_f$, to a node 208 and the negative input of amplifier 202. Node 208 is driven by a current 212, $I_{DAC}$. Node 204 is connected to an integrated circuit pad 218 at the boundary of an integrated circuit. The pad 218 is connected on an exterior of the integrated circuit to one side of an external resistor 220, $R_{EXT}$, the other circuit. The pad 218 is connected on an exterior of the integrated circuit to one side of an external resistor 220, $R_{EXT}$, the other side of resistor 220 connected to an output node 222. Output node 222 is connected through a load resistor 224, $R_L$, to ground via a voltage source 226, resistor 224 representing a reflected impedance. The amplifier 202 reduces the output impedance of the output stage such that the impedance match only depends on the external resistor 220. However, the amplifier 202 has a finite bandwidth, which limits the ability to match the load 224. Assuming that $R_{EXT}=R_L$, this will result in:

$$\frac{V_{OUT}}{I_{DAC}} = \frac{R_f}{2} \qquad 001.$$

Figure 3:
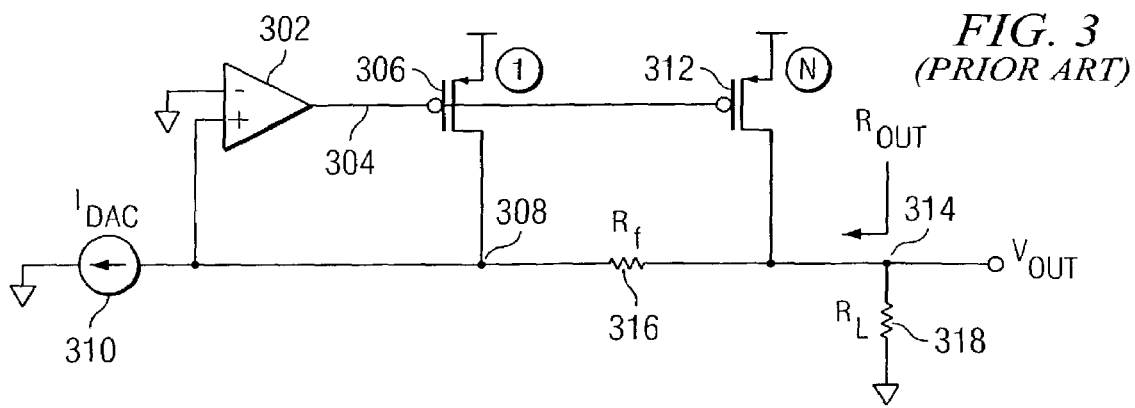

Referring now to FIG. 3, there is illustrated a schematic diagram of a prior art line driver with voltage and current feedback. This embodiment of FIG. 3 is disclosed in U.S. Pat. No. 5,121,080, issued Jun. 9, 1992, the disclosure of which is incorporated herein by reference. An amplifier 302 has the negative input thereof connected to ground (or a common mode voltage) and the output thereof connected to a node 304. Node 304 is operable to drive the gate of a first P-channel transistor 306 having the source-drain path thereof connected between $V_{DD}$ and a node 308, which node 308 is connected to the positive input of amplifier 302 and also to a current driver 310. Node 304 is also connected to the gate of a P-channel transistor 312, the source-drain path thereof connected between $V_{DD}$ and to an output node 314. A feedback resistor 316, $R_f$, is connected between nodes 308 and 314 and a load resistor 318 is connected between the output node 314 and ground. The first transistor 306 comprises the first stage of current drive utilizing a transistor 306, with a second stage provided by transistor 312, this being a "replica" stage of the first stage in that it is driven by the amplifier 302 and provides a current therethrough that is directly proportional to the current in the first stage. The ratio of these two current drive stages corresponds to the ratio of the current drive in the two transistors 306 and 312. The output at node 314 is a voltage output.

The aspect ratio between the transistors 306 and 312 is set such that the first transistor 306 is given a value of "1" and the second is given a value of "N." The output impedance of the amplifier is a function of the current ratio between the two transistors 306 and 312 as well as the value of the feedback resistor 316. This provides a constant ratio between the current drive and the output current. In essence, current drive is added to the summing node utilizing a replica of the first output stage, with the output impedance depending upon the on-chip feedback resistance 316 such that adjustment of either the feedback resistor 316 or the value of "N" will allow adjustment of the output impedance. However, adjusting of the value of "N" leads to a DAC current which needs to scale inversely proportional to "N." The value of the output impedance, $R_{OUT}$, is set as follows:

$$R_{OUT} = \frac{R_f}{N+1} \qquad 002.$$

Assuming that the output impedance, $R_{OUT}$, is set equal to the load impedance, $R_L$, then the following relationship exists:

$$\frac{V_{OUT}}{I_{DAC}} = \frac{N}{2}R_L \qquad 003.$$

Figure 4:
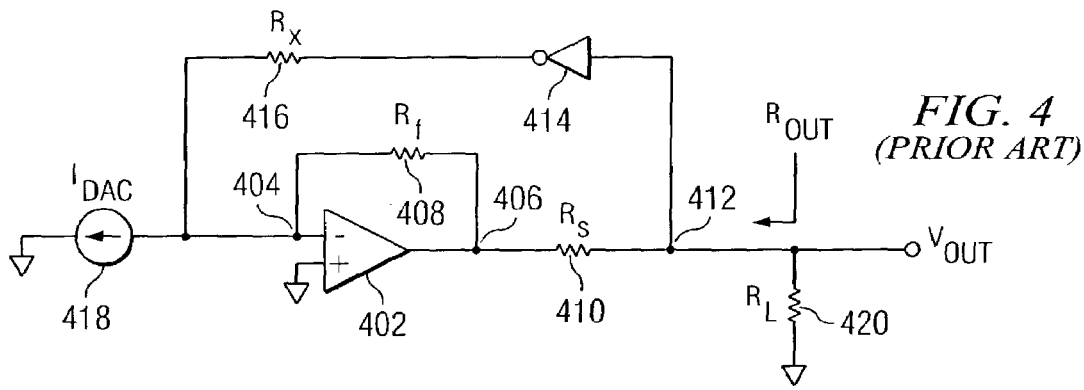

Referring now to FIG. 4, there is illustrated a schematic diagram of a prior art line driver using positive and negative voltage feedback. This embodiment of FIG. 4 is disclosed in U.S. Pat. No. 5,585,763, issued Dec. 17, 1996, the disclosure of which is incorporated herein by reference. An amplifier 402 is provided having the positive input thereof connected to ground and the negative input thereof connected to a node 404. The output thereof is connected to a node 406. Negative feedback is provided by connecting the node 406 to the node 404 through a feedback resistor 408. The node 406 is connected through a series resistance 410 to an output node 412. Positive feedback is provided with a node 412 connected through an inverter 414 to one side of a positive feedback resistor 416, the other side of resistor 416 connected to node 404. Node 404 is driven by a DAC current 418. The output node 412 is connected to a load resistor 420.

In the configuration of FIG. 4, the termination resistor 410 is incorporated on-chip. The positive feedback provided by resistor 416 and inverter 414 allows the nominal value of the series resistor 410 to be lower than the desired value of $R_{OUT}$. However, the output impedance can vary as a function of on-chip resistance, and trimming is still required.

Figure 5A:
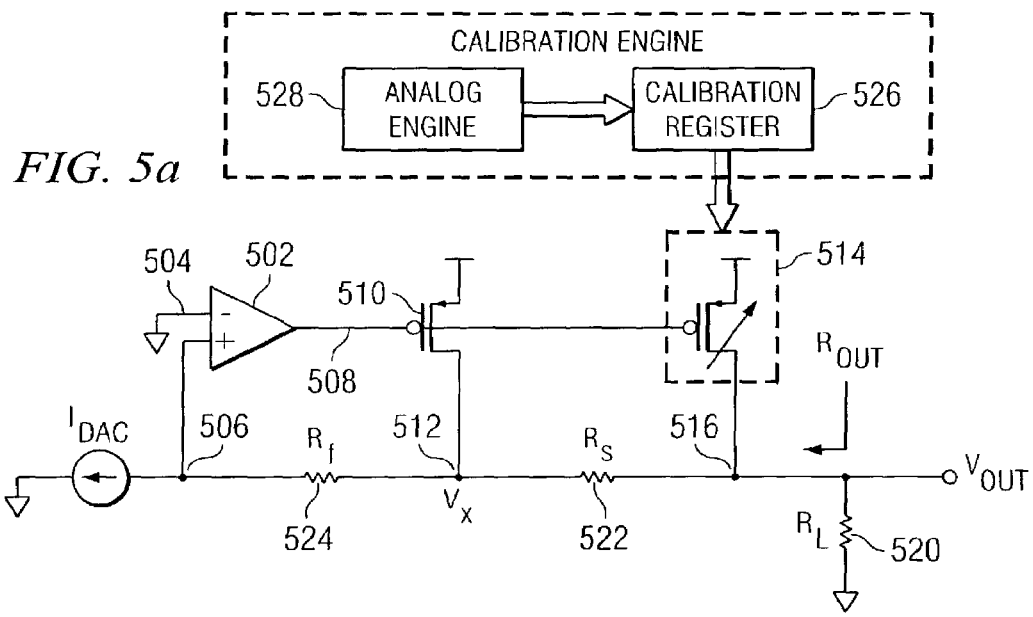
FIG. 5A illustrates a diagrammatic view of the line driver of the present disclosure.

Referring now to FIG. 5A, there is illustrated a schematic diagram of the line driver of the present disclosure. An amplifier 502 is provided having the negative input thereof connected to ground on a line 504 (or to a common mode voltage) with the positive input thereof connected to a node 506. The output of amplifier 502 is connected to a node 508. Node 508 is connected to the gate of a P-channel transistor 510, a first stage of amplification, the source-drain path thereof connected between $V_{DD}$ and a node 512 labeled $V_X$. Node 508 is also connected to the gate of a variable replica stage 514 which provides for a plurality of transistors to be connected in parallel, the source-drain paths of the transistors connected between $V_{DD}$ and an output node 516. Node 516 is connected to one side of a load resistor 520, $R_L$, and also to one side of a series resistor 522, the other side of resistor 522 connected to node 512, resistor 522 labeled "$R_s$." Node 512 is connected to one side of a feedback resistor 524, labeled $R_f$, the other side thereof connected to the node 506.

Figure 5B:
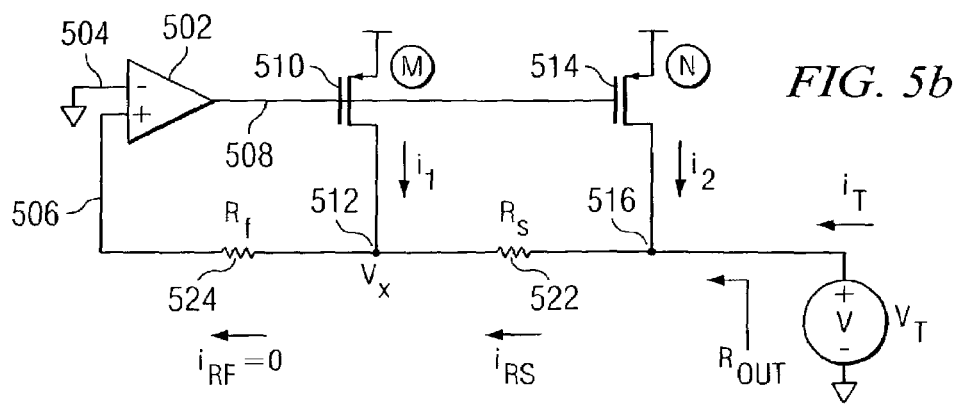
FIG. 5B illustrates diagrammatic view of a test circuit for determining the value of the output impedance.

The current through the variable replica stage 514 is a function of the number of transistors that are connected in parallel. This is determined by a value in a calibration register 526. This value is determined by an analog engine 528, the operation of which will be described hereinbelow, and which analog engine 528 and register 526 form the calibration engine 118. In order to determine the value of the output impedance $R_{OUT}$ as a function of the series resistance 522 and the ratio of the transistor 510 and the parallel transistors in the variable replica stage 514, reference is now made to FIG. 5B illustrating a test circuit. In FIG. 5B, node 506 is open circuited, i.e., the DAC current is disconnected from the amplifier 502 or set to a value of zero, and a test voltage $V_T$ impressed across the output node 516 and ground. This will result in a current $i_T$ directed toward node 516. For this description, there will be a current $i_2$ flowing from $V_{DD}$ through variable current stage 514 wherein variable current stage 514 is illustrated as a single transistor, and a current $i_1$ flowing from $V_{DD}$ through transistor 510 to node $V_X$. There will be no current flowing through the feedback resistor 524, with a current $i_{RS}$ flowing through the series resistor 522 from node 516 to node 512, node 512 being a summing node. It is noted that the positive node of amplifier 502 is a virtual ground and, therefore, the voltage on node 512, $V_X$, will be substantially equal to zero. The ratios of the transistor 510 and the parallel connected transistors in the variable replica stage 514 are defined such that a value of "M" is assigned for the transistor 510 and a value of "N" is assigned for the transistors in the variable replica stage 514 to provide a ratio of N/M which defines the ratio of the sizes of the parallel combined transistors in the replica stage 514 and the transistor 510, it being understood that the value of "N" can be varied. The following derivation can be made with respect to the structure of FIG. 5B:

$$i_T + (-i_{RS})\frac{N}{M} = i_{RS} \quad \therefore i_T = i_{RS}\left(1 + \frac{N}{M}\right) \quad 004.$$

$$V_T = R_S i_{RS} \quad 005.$$

$$R_{OUT} = \frac{V_T}{i_T} \quad 006.$$

$$i_T + i_2 = i_{RS} \quad 007.$$

$$i_1 + i_{RS} = 0 \quad \therefore i_1 = -i_{RS} \quad 008.$$

$$\frac{i_2}{i_1} = \frac{N}{M} \quad \therefore i_2 = i_1 \frac{N}{M} \quad 009.$$

$$i_T + i_1 \frac{N}{M} = i_{RS} \quad 010.$$

$$i_{RS} = \left(\frac{1}{1+\frac{N}{M}}\right) i_T \quad 011.$$

$$V_T = \left(\frac{1}{1+\frac{N}{M}}\right) i_T R_S \quad 012.$$

$$\frac{V_T}{i_T} = \left(\frac{1}{1+\frac{N}{M}}\right) R_S = R_{OUT} \quad 013.$$

It can be seen from Equation 13 that the value of $R_{OUT}$ is a function of the fixed value of $R_S$ and the ratio of N and M. Therefore, it is only required that one of the values of N or M be varied in order to change the value of $R_{OUT}$. In the present embodiment, the value of N is varied.

Figure 6:
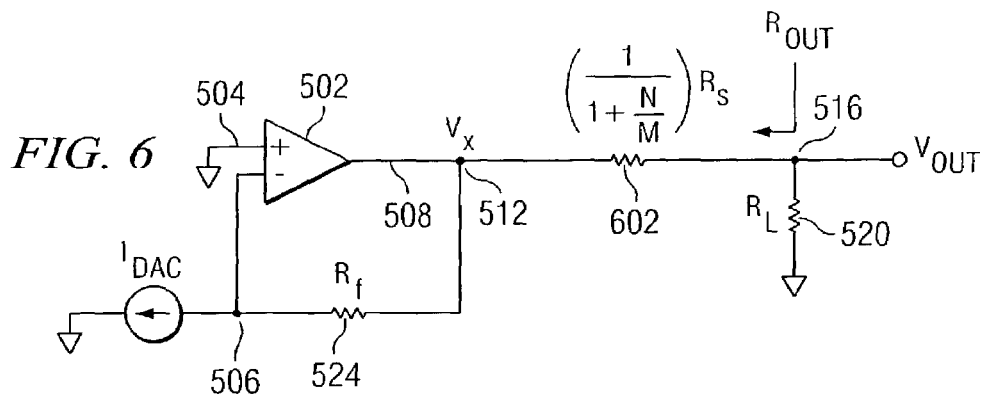
FIG. 6 illustrates an equivalent circuit for the line driver of FIG. 5.

Once the value of $R_{OUT}$ is determined, then the behavior of the output voltage can then be determined. This is determined with reference to the equivalent circuit of FIG. 6, wherein the transistor 510, variable replica stage 514 and series resistor 522 are all replaced by a series resistance 602 having the relationship defined hereinabove in Equation 13. The following equations can be derived from this equivalent structure:

$$V_x = R_f I_{DAC} \quad 014.$$

$$V_o = \left[\frac{R_L}{R_L + \left(\frac{1}{1+\frac{N}{M}}\right)R_s}\right] V_x \quad 015.$$

$$V_o = \left[\frac{R_L}{R_L + \left(\frac{1}{1+\frac{N}{M}}\right)R_s}\right] R_F I_{DAC} \quad 016.$$

$$\frac{V_O}{I_{DAC}} = \frac{R_L R_F}{R_L + \left(\frac{1}{1+\frac{N}{M}}\right)R_s} = \frac{R_F}{2} \quad \text{for} \quad \left(\frac{1}{1+\frac{N}{M}}\right)R_s = R_L \quad 017.$$

In this condition:

$$V_O = \frac{R_F}{2} I_{DAC} \quad 018.$$

It can therefore be seen that the output voltage is a function of the feedback resistor $R_f$ and the drive current and, therefore, independent control of the output voltage is provided apart from the output impedance control.

Figure 7:
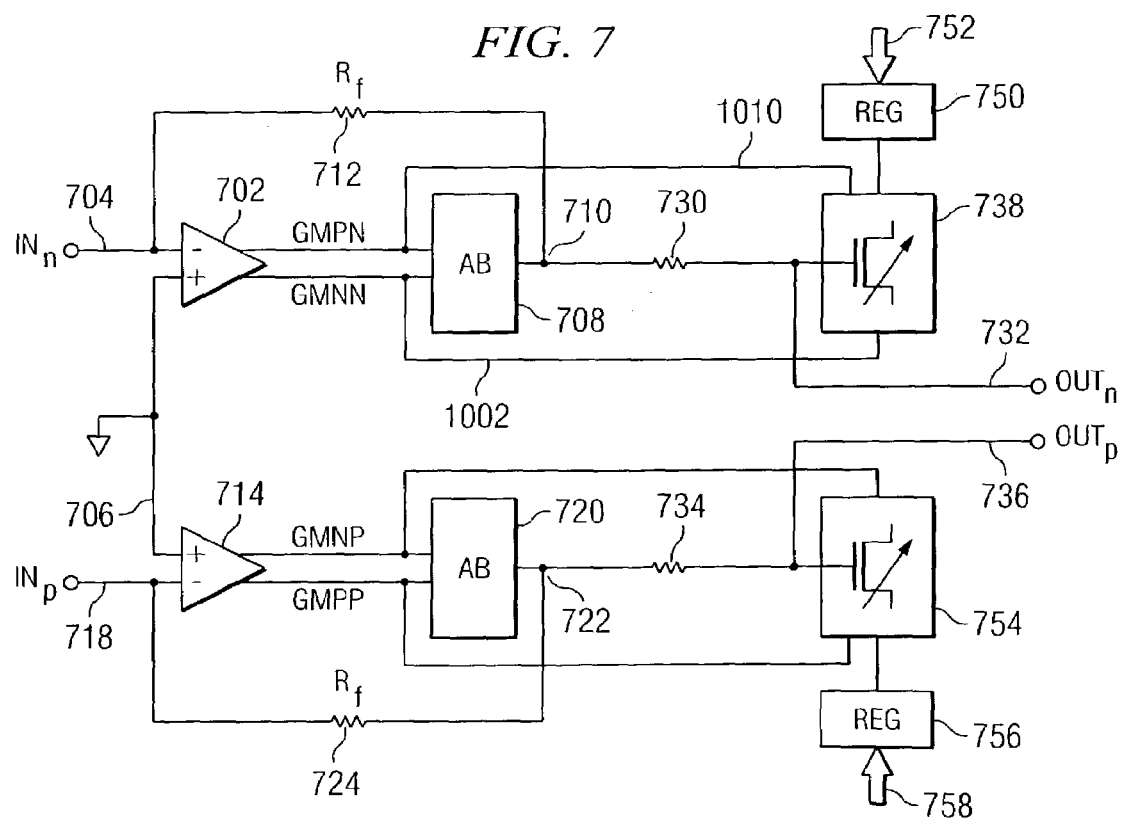
FIG. 7 illustrates a differential implementation of the line driver of the present disclosure.

Referring now to FIG. 7, there is illustrated an implementation of a line driver for a differential configuration. A first differential amplifier 702 is provided having the negative input thereof connected to a negative input terminal 704 and the positive input thereof connected to a common mode or ground node 706. The amplifier 702 is a folded cascode amplifier that provides positive and negative differential outputs gmpn and gmnn, respectively, which are input to a class AB output stage 708. The output therefrom is connected to a node 710. Node 710 is connected through a feedback resistor 712 to node 704. A similar folded cascode amplifier 714 is provided having the positive input thereof connected to the common mode node 706 and the negative input thereof connected to a positive input terminal 718. The output of amplifier 714 is comprised of a positive and a negative differential output gmnp and gmpp which are input to a class AB output stage 720, the output thereof connected to a node 722. Node 722 is connected through a feedback resistor 724 to node 718.

Node 710 is connected through a series resistor 730 to a positive output node 732. Similarly, node 722 is connected through a series resistor 734 to a negative output node 736. Node 732 is connected to a variable replica stage 738 which provides a variable current drive to node 732 proportional to the current drive provided by the class AB stage 708, which class AB stage 708 provides the first stage of amplification. The value of the current in the variable replica stage 738 relative to the class AB stage 708 is determined by a calibration value stored in a register 750, which was received from a calibration input 752. Similarly, node 736 is connected to a variable replica stage 754, which provides a variable current drive to node 736 that is proportional to the current drive provided by the class AB stage 720, the first stage of amplification associated with node 736. The value of the current in the variable replica stage 754 relative to the class AB stage 720 is defined by a value stored in a register 756, which is stored therein through an input 750, which will be described hereinbelow.

Figure 8:
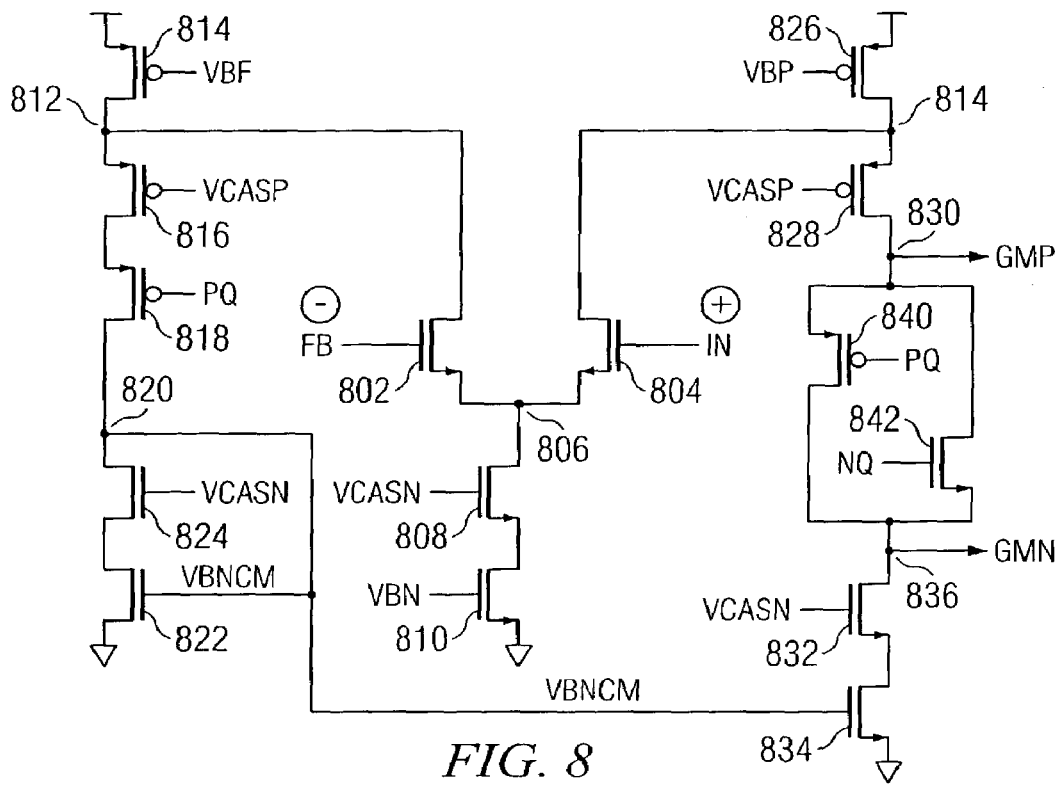
FIG. 8 illustrates a schematic diagram of one side of the differential amplifier portion of the line driver.

Referring now to FIG. 8, there is illustrated a schematic diagram of the differential amplifier 702 and the differential amplifier 714, both being substantially the same. The input is comprised of a differential pair of N-channel transistors 802 and 804 with a common source connecting to a node 806. Node 806 is connected through two series connected N-channel transistors 808 and 810 to ground, transistor 808 having the gate thereof connected to a cascode bias voltage VCASN, and the transistor 810 having the gate thereof connected to the current source bias voltage VBN. The differential input transistor 802 has the gate thereof connected to the negative feedback signal FB, with the transistor 804 having the gate thereof connected to the positive input signal, IN. The drain of transistor 802 is connected to a node 812 and the drain of transistor 804 is connected to a node 814.

The node 812 is connected to one leg of the amplifier to provide a cascode operation. A P-channel transistor 814 has the source-drain path thereof connected between $V_{dd}$ and node 812, and the gate thereof connected to a current source bias voltage vbp. A pair of P-channel transistors 816 and 818 are connected in series between node 812 and a node 820, the gate of transistor 816 connected to a cascode bias voltage vcasp and the gate of transistor 818 connected to a p-channel bias voltage pq (this is the PMOS Class AB Quiescent current control voltage). Node 820 is connected to the lower side of the leg for the N-channel portion with two cascoded N-channel transistors 822 and 824 connected in series between node 820 and ground. Transistor 822, having the source thereof connected to ground, has the gate thereof connected to node 820, with the gate of transistor 824 connected to the cascode bias signal vcasn.

The node 814 is connected to a second leg, the output leg, that is also a cascode leg. A P-channel transistor 826 is connected between $V_{dd}$ and node 814, with the gate thereof connected to a current source bias voltage vbp. A cascode P-channel transistor 828 is connected between node 814 and an output node 830 to provide the gmp output signal. The lower portion of the output leg is comprised of two series connected N-channel transistors 832 and 834 between ground and a node 836 representing a gmn output signal. The gate of transistor 834 is connected to node 820 and the gate of transistor 832 is connected to a cascode bias signal vcasn. Between nodes 830 and 836 are provided two parallel connected transistors, a P-channel transistor 840 having the source-drain path thereof connected between nodes 830 and 836 and the gate thereof connected to bias signal pq (the PMOS Class AB Quiescent current control voltage). The N-channel transistor 842 is connected between nodes 830 and 836 with the gate thereof connected to the n-channel bias signal nq (the NMOS Class AB Quiescent current control voltage).

Figure 9:
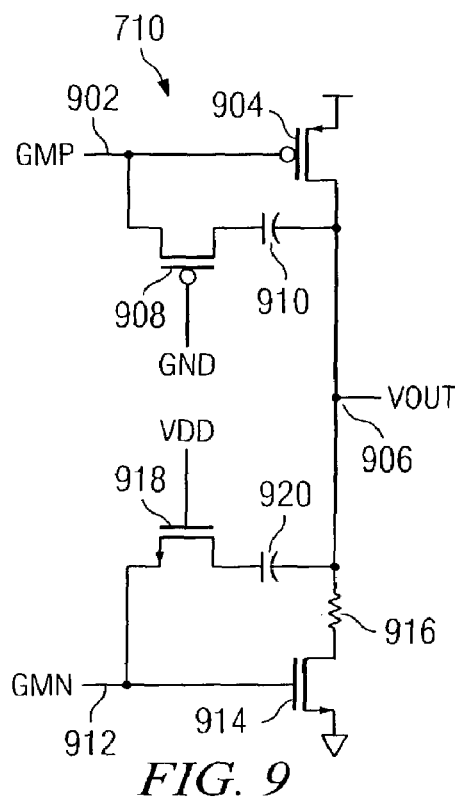
FIG. 9 illustrates a schematic diagram of the class AB amplifier associated with the line driver.
Figure 10:
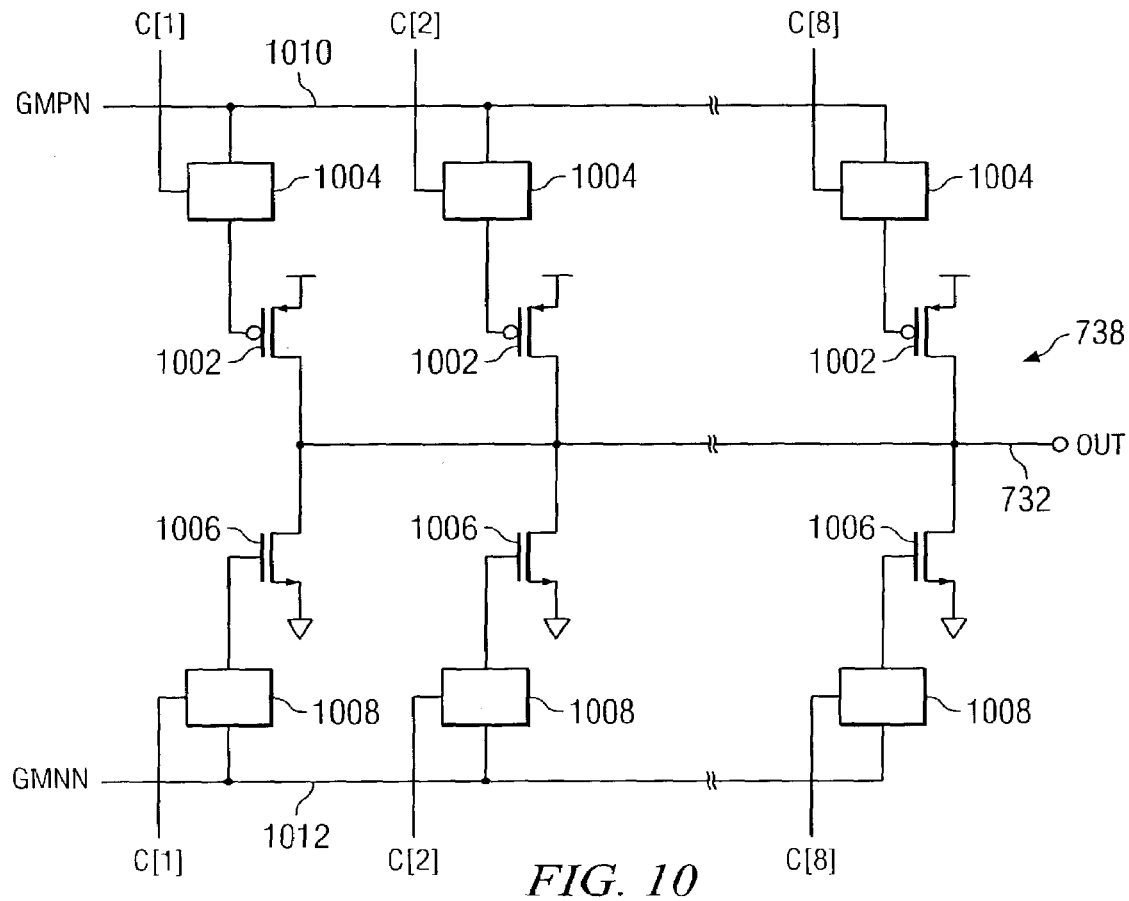
FIG. 10 illustrates a diagrammatic view of the replica stage.

Referring now to FIG. 9, there is illustrated a schematic diagram of the Class AB stages 708 and 720. The gmp signal is input on a node 902 to the gate of a P-channel transistor 904 having the source-drain path thereof connected between the $V_{dd}$ and the output node 906. A P-channel transistor 908 has the source-drain path thereof connected between node 902 and through a capacitor 910 to the output node 906, and the gate thereof connected to ground. The gmn signal is connected to a node 912 and to the gate of an N-channel transistor 914. Transistor 914 has the source-drain path thereof connected to ground and through a series ballast resistor 916 to the output node 906. An N-channel transistor 918 has the source-drain path thereof connected between node 912 and through a capacitor 920 to node 906. The gate of transistor 918 is connected to the voltage $V_{dd}$. The function of the transistor 510 is provided by one side of the transistor 904 and the transistor 914 in a class AB operation Referring now to FIG. 10, there is illustrated a schematic diagram of the variable replica stage 738, the variable replica stage 754 being similar. A plurality of transistor pairs are provided, each transistor pair having a P-channel transistor 1002 having the source-drain path thereof connected between $V_{DD}$ and the output terminal 732, and the gate thereof connected to a control switch 1004. An N-channel transistor 1006 is provided having the source-drain path thereof connected between the output terminal 732 and ground, and the gate thereof connected to a control switch 1008. In the present disclosed embodiment, there are provided eight transistor pairs, each having associated therewith a control switch 1004, associated with the P-channel side, and a control switch 1008 associated with the N-channel side. The control switches 1004 are operable to selectively connect the gmpn output on a line 1010 from the output of the folded cascode amplifier 702 to the gate of the associated P-channel transistor 1002. The control switches 1008 are operable to selectively connect the gmnn output of the folded cascode amplifier 702 on a line 1012 to the gate of the associated N-channel transistor 1002. Selection of one or more of these pairs provides the function of the variable replica stage 514 of FIG. 5.

Figure 11:
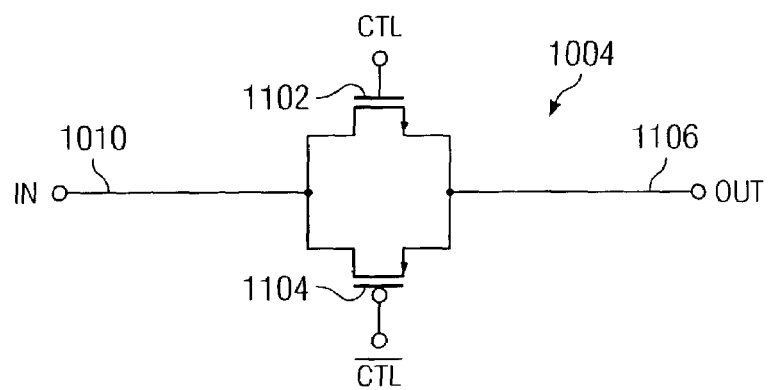
FIG. 11 illustrates a schematic diagram of a control switch associated with the replica stage.

Referring now to FIG. 11, there is illustrated a schematic view of one of the switches 1004, the switches 1008 being similar. The gmpn input is provided on the node 1010 which is connected to a transfer gate comprised of a N-channel transistor 1102 connected in parallel with an P-channel transistor 1104 such that the source-drain paths thereof are connected in series between the node 1010 and an output node 1106 that is connected to the gate of associated one of the P-channel transistors 1002. The gate of N-channel transistor 1102 is connected to the respective control signal "ctl" with the gate of the P-channel transistor 1104 connected to the inverse thereof, ctl-Bar.

Figure 12:
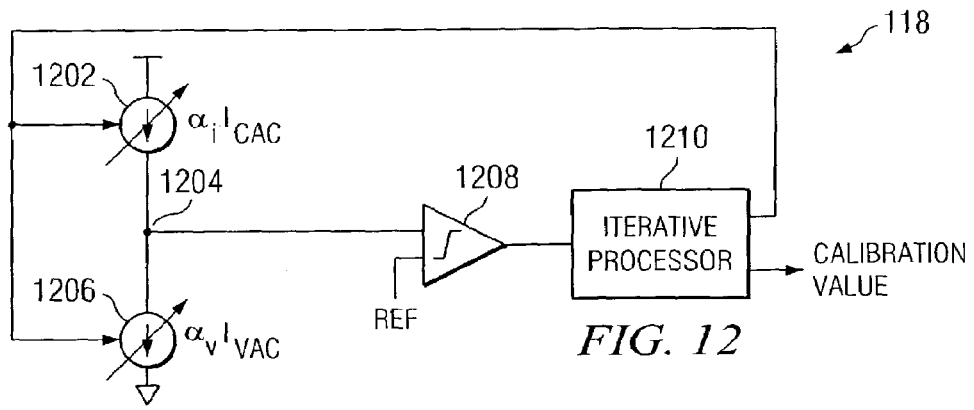
FIG. 12 illustrates a diagrammatic view of the calibration engine.

Referring now to FIG. 12, there is illustrated a diagrammatic view of the calibration engine 118. The calibration engine is a calibration device that operates independent of the line driver, i.e., it determines the calibration value to be stored in the calibration registers 750 or 756 through an a priori algorithm. This algorithm utilizes two current sources, a process independent current source and a process dependent current source, to adjust for variations in the process. A variable process independent current source 1202 labeled $\alpha_i I_{CAC}$ is provided and connected between a supply voltage and a summing node 1204. The current $I_{CAC}$ is referred to as a "current accurate current." A variable process dependent current source 1206 labeled $\alpha_v I_{VAC}$ is provided that is connected between the summing node 1204 and ground. The current $I_{VAC}$ is referred to as a "voltage accurate current." By adjusting the two current sources 1202 and 1206 to gain a balance therebetween such that no current is output from the summing node 1204, an adjustment value for the variable replica stage can be determined, as will be described in more detail hereinbelow. A comparator 1208 is provided having one input thereof connected to the summing node 1204 and the other node thereof connected to a reference, the comparator 1208 determining the polarity of the current into the node 1204 from the comparator or to the comparator 1208 from the node 1204. An iterative processor 1210 is provided for varying the currents in current sources 1202 and 1206 in order to set the current into or from the node 1204 to a value of "0" such that the current of current source 1202 equals the current of current source 1206. When these are balanced, this results in a calibration value which is latched and output from the iterative processor 1210. Whenever there is a change in the current of the variable process dependent current source, this is the direct result of a process variation in the integrated circuit from the nominal design for that integrated circuit. Since the series resistance $R_S$ is fabricated on the integrated circuit substrate with the process dependent current source, then there will be a process dependent correlation therebetween that is used to determine a calibration value for the series resistance $R_S$ and, hence, for the output impedance.

Figure 13:
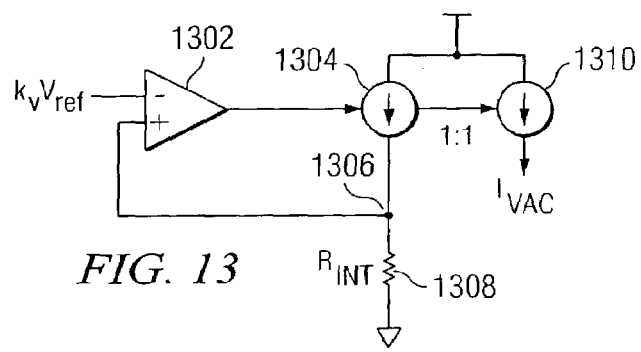
FIG. 13 illustrates a diagrammatic view of the voltage accurate current generator.

Referring now to FIG. 13, there is illustrated a reference voltage accurate current source that is process dependent. An amplifier 1302 is provided having the negative input thereof connected to a process and temperature independent voltage source with a value $k_v V_{ref}$, which is generated by an internal voltage generator such as a band-gap voltage generator. The output of amplifier 1302 drives a current source 1304 connected between the supply voltage and a node 1306 connected to the positive input of amplifier 1302 and to one side of an internal resistor 1308 labeled $R_{INT}$, the other side of resistor 1308 connected to ground. The resistor 1308 is substantially identical with respect to the fabrication process as the series resistor 522. Therefore, any process variations that would vary the value of resistor 522 would be directly proportional to those associated with resistor 1308, or, to state it differently, the current through current source 1304 is a process dependent current source that will vary as a function of the process associated with the series resistor 522. This current source 1304 is mirrored to a current mirror 1310 to provide an output current $I_{VAC}$ which has the following relationship:

$$I_{VAC} = k_V \frac{V_{ref}}{R_{INT}} \qquad 019.$$

Figure 14:
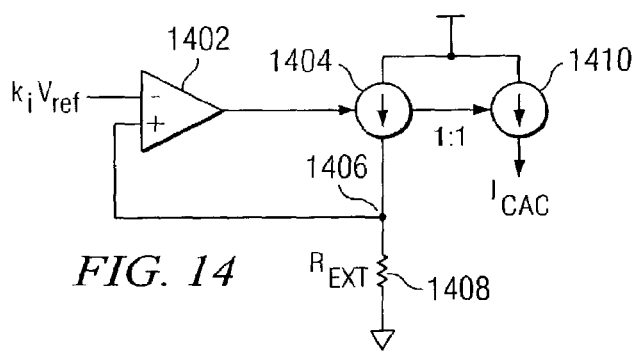
FIG. 14 illustrates a diagrammatic view of the current accurate current generator.

Referring now to FIG. 14, there is illustrated a current accurate current source reference. An amplifier 1402 is provided having the negative input thereof connected to a voltage reference $k_I V_{ref}$, which is generated by the internal voltage generator, such as a band-gap generator. The output of amplifier 1402 is connected to a current source 1404 which is connected between the supply voltage and a node 1406 connected to the positive input of amplifier 1402 and to one side of a resistor 1408, labeled $R_{EXT}$, the other side of resistor 1408 connected to ground. Current source 1404 is mirrored to a current mirror 1410, the output thereof providing the current accurate current, $I_{CAC}$ which will have the following relationship:

$$I_{CAC} = k_I \frac{V_{ref}}{R_{EXT}} \qquad 020.$$

As noted hereinabove, the current source 1202 has a current value of $\alpha_v I_{VAC}$ and the current 1206 has a current value of $\alpha_I I_{CAC}$. These two currents will be equal when the device is calibrated. This will result in the following relationship when the currents for both of the current sources 1202 and 1206 are set equal:

$$\alpha_I k_I \frac{V_{ref}}{R_{EXT}} = \alpha_V k_V \frac{V_{ref}}{R_{INT}} \qquad 021.$$

$$R_{INT} = \frac{\alpha_V k_V}{\alpha_I k_I} R_{EXT} \qquad 022.$$

Figure 15:
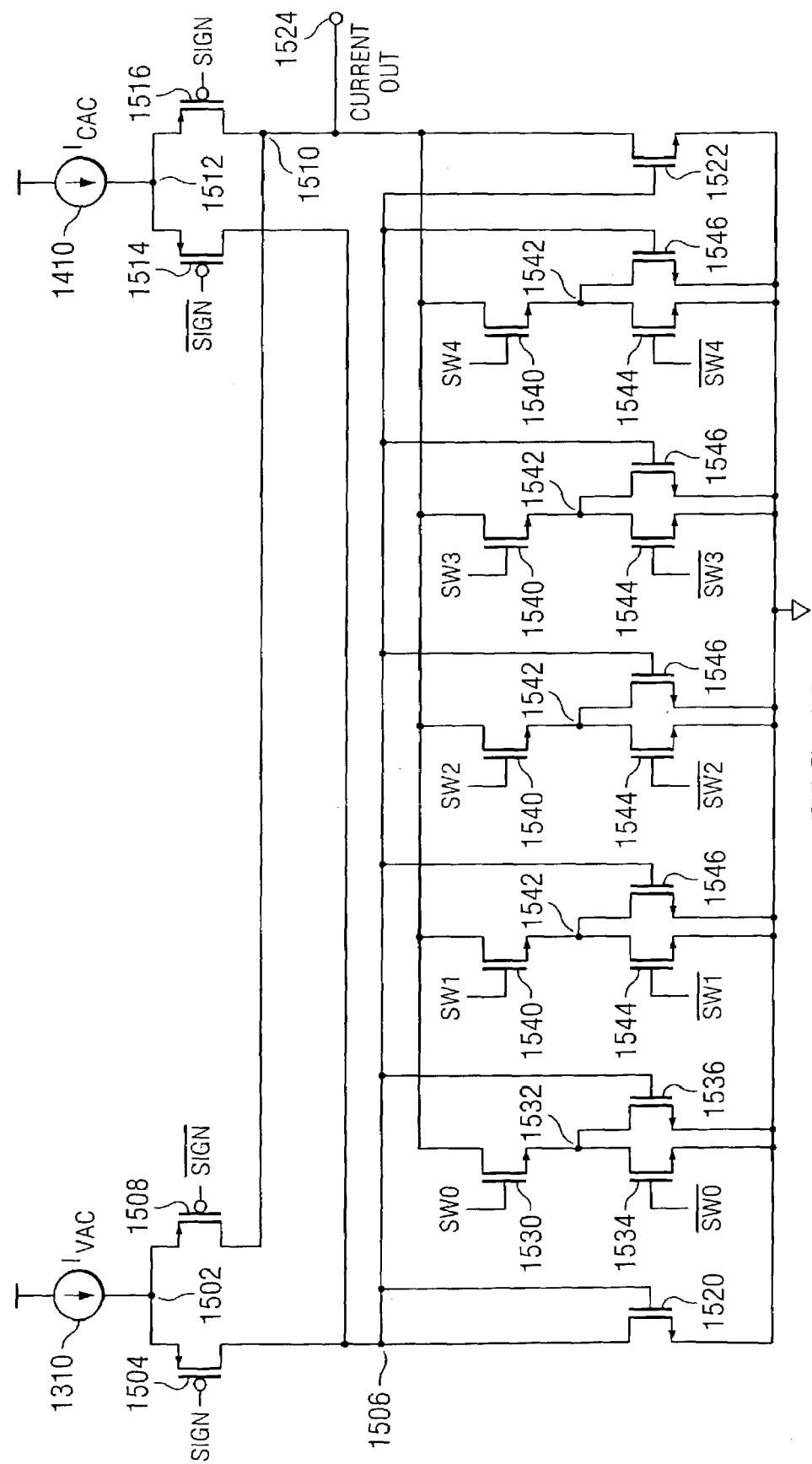
FIG. 15 illustrates a schematic diagram of the analog portion of the calibration engine for varying the current in the calibration engine.
Figure 17:
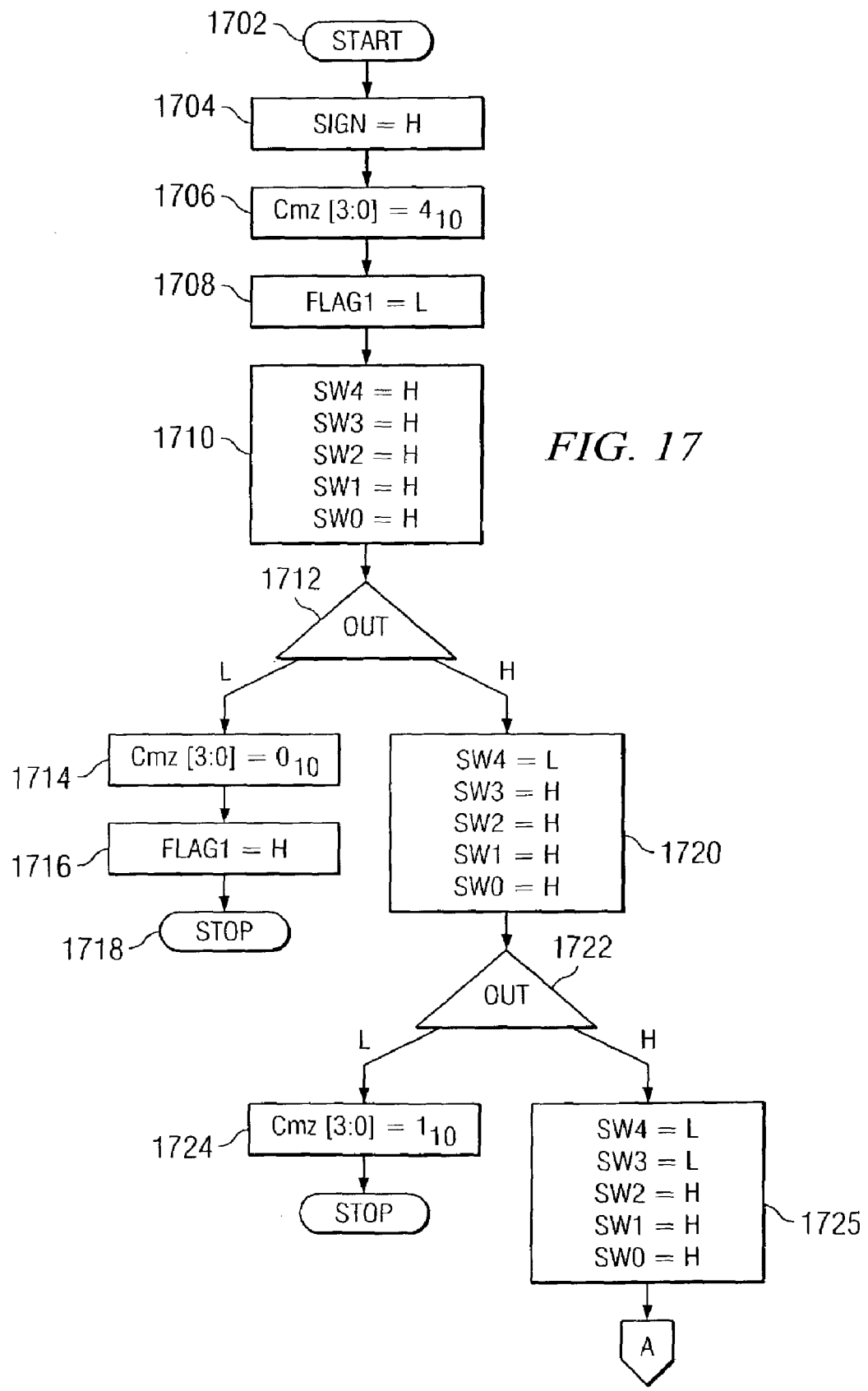
FIGS. 17–20 illustrate flowcharts for the operation of the digital portion of the iterative processor of the calibration engine.

Referring now to FIG. 15, there is illustrated a schematic diagram of the analog portion of the calibration engine which provides the adjustment for the two currents, the current accurate current and the voltage accurate current. The current from the voltage accurate current mirror 1310 is connected to a node 1502, which node 1502 is connected through the source-drain path of the P-channel transistor 1504 to a node 1506 and through the source-drain path of a P-channel transistor 1508 to a node 1510. Transistor 1504 has the gate thereof connected to the SIGN signal and the gate of transistor 1508 is connected to SIGN-Bar. The current source 1410 for the current accurate current is similarly connected to a node 1512, which node 1512 was connected through the source-drain path of a P-channel transistor 1514 to node 1506 and through the source-drain path of a P-channel transistor 1516 to node 1510. The gate of transistor 1514 is connected to SIGN-Bar and gate of transistor 1516 is connected to SIGN.

The transistors 1504, 1508, 1514 and 1516 are controlled such that one of the current sources 1310 and 1410 will source current to the node 1506, whereas the other thereof will source current to the node 1510, these being switchable for reasons that will be described hereinbelow. Node 1506 is connected through the source-drain path of an N-channel transistor 1520 to ground, with the gate thereof connected to the drain thereof. Node 1506 is also connected to the gate of an N-channel transistor 1522, the source-drain path thereof connected between ground and node 1510. Therefore, the current through transistor 1520 will be mirrored to transistor 1522. The nominal current through transistor 1520 is set to 25 µA and the transistor 1522 is sized such that the current therethrough will nominally be 25 µA. If the current provided to node 1510 from the source 1310 or 1410 connected thereto is not balanced, any excess current will be output on a current output node 1524.

There are provided five levels of adjustment of current between a node 1510 and ground for adjusting the size of the current mirror transistor 1522. These each will provide an adjustment of approximately four percent. These are controlled by switch signals SW[0]–SW[4]. The first of these current adjustment stages is comprised of a first N-channel transistor 1530 connected between node 1510 and a node 1532, with a second N-channel transistor 1534 connected between node 1532 and ground. The gate of transistor 1530 is connected to the SW[0] switch signal and the gate of transistor 1534 is connected to the SW[0]-Bar signal. Node 1532 is connected to one side of the source-drain path of an N-channel transistor 1536, the other side connected to ground and the gate of transistor 1536 connected to node 1506. Therefore, when SW[0] is a logic "high," current will flow through transistor 1536, which is connected such that the source-drain path thereof will be in parallel to transistor 1522, thus increasing the current that can be sinked from node 1510 to ground. The value of the current through transistor 1536 will be approximately 1.0 µA.

Each of the remaining four stages in FIG. 15 disposed between node 1510 and ground is each comprised of a first N-channel transistor 1540 connected between node 1510 and a respective intermediate node 1542, with the node 1542 connected through the source-drain path of a second N-channel transistor 1544 to ground. The respective gate of each of the transistors 1540 is connected to a respective one of the remaining four control signals SW[1] to SW[4], with the respective gate of each of the transistors 1544 connected to the inverse of the associated switch control signal of the last four stages. By selecting any of the stages, the respective transistor 1546 for the last four stages or the transistor 1536 for the first stage are mirrored to the transistor 1520, such that the mirrored current is sinked from node 1510 to ground.

In operation, the iterative processor 1210 is first operable to connect one of the current sources 1310 and 1410 to node 1506 and one to node 1510 with the five stages off and determine if the current flowing out of the current output terminal 1524 is positive. If positive, this indicates that the sinking of current through any of the five stages will decrease the current flow out of current node 1524. However, if current is into the node 1524 with all of the switch control signals set to a logic "low," then the high current one of the two current sources 1310 and 1410 is connected to node 1506 and they need to be reversed by changing the logic state of SIGN. Once the higher of the two current mirrors 1310 and 1410 is determined and connected to node 1510, then the iterative process is begun and the value of SW[0:4] is determined to set the current out of node 1524 to a value of "0," and this value can then be correlated with a lookup table, or a preset correlation between the switch control signals and the control signals for the variable replica stage(s) to determine a corresponding control word C[1:8] to control the value of "N."

Figure 16:
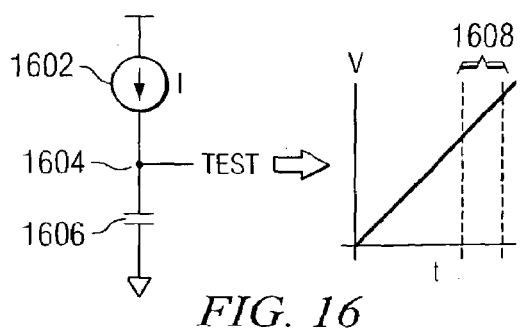
FIG. 16 illustrates an alternate embodiment of calibration.

Referring now to FIG. 16, there is illustrated a diagrammatic view of an alternate embodiment of the calibration operation. In this embodiment, a process dependent current source 1602 drives a node 1604 with a current that is directly proportional to the resistance of the series resistor. A process dependent capacitor 1606 is connected between node 1604 and ground. The charge time of the capacitor 1606 is measured and a correlation between the measured time and expected time is then determined and a calibration value determined therefrom. There is a range 1608 within which the calibration can be facilitated. Calibration outside of that range is not possible.

Referring now to FIGS. 17–20, there is illustrated a flowchart depicting the iterative process. The flowchart is initiated at a block 1702 and then proceeds to a block 1704 to set SIGN to a logic "high." The program then flows to a function block 1706 to set the control word associated with the value of N to a value of "4," the control word being a four bit word such that the digital value will be "0100." This is a nominal value for the starting position. The program then flows to a function block 1708 to set an internal flag to a low logic state, which internal flag indicates that the system is able to be calibrated. If the value of the flag were a logic high, this would indicate that it could not be calibrated, i.e., changing of the switch values on the variable current source has insufficient range to cause a toggle at the output. Initially, this value is set to a logic "low" and then the program proceeds to a function block 1710 wherein all of the switches are set with the gates thereof to a logic "high" level such that they will cause maximum current to be sinked by the current mirror. The program then flows to a function block 1712 to determine if sinking the maximum current will cause the output to toggle. If not, this indicates that the process variation in the series resistor cannot be compensated and the program will flow along an "L" path to a function block 1714 to set the value of N at its lowest value, this value being a decimal zero The program then proceeds to function block 1716 to set the flag value to a logic high, indicating the system cannot be calibrated and then to a STOP block 1718.

If at decision block 1712, a toggle occurred in that the current was flowing out of the variable current mirror, the program would proceed to a function block 1720 to set the value of one of the switches in the variable current mirror to a logic "low" state, this being SW[4]. The program then flows to a decision block 1722 to determine if this toggled the output. If so, the program proceeds along a "L" path to a function block 1724 to set the control word to a value of decimal "1." If it did not toggle, the program would proceed along the "H" path to a function block 1724 to set the value of both SW[4] and SW[3] to a low logic state and then proceed to a decision block 1726 in FIG. 18.

Figure 18:
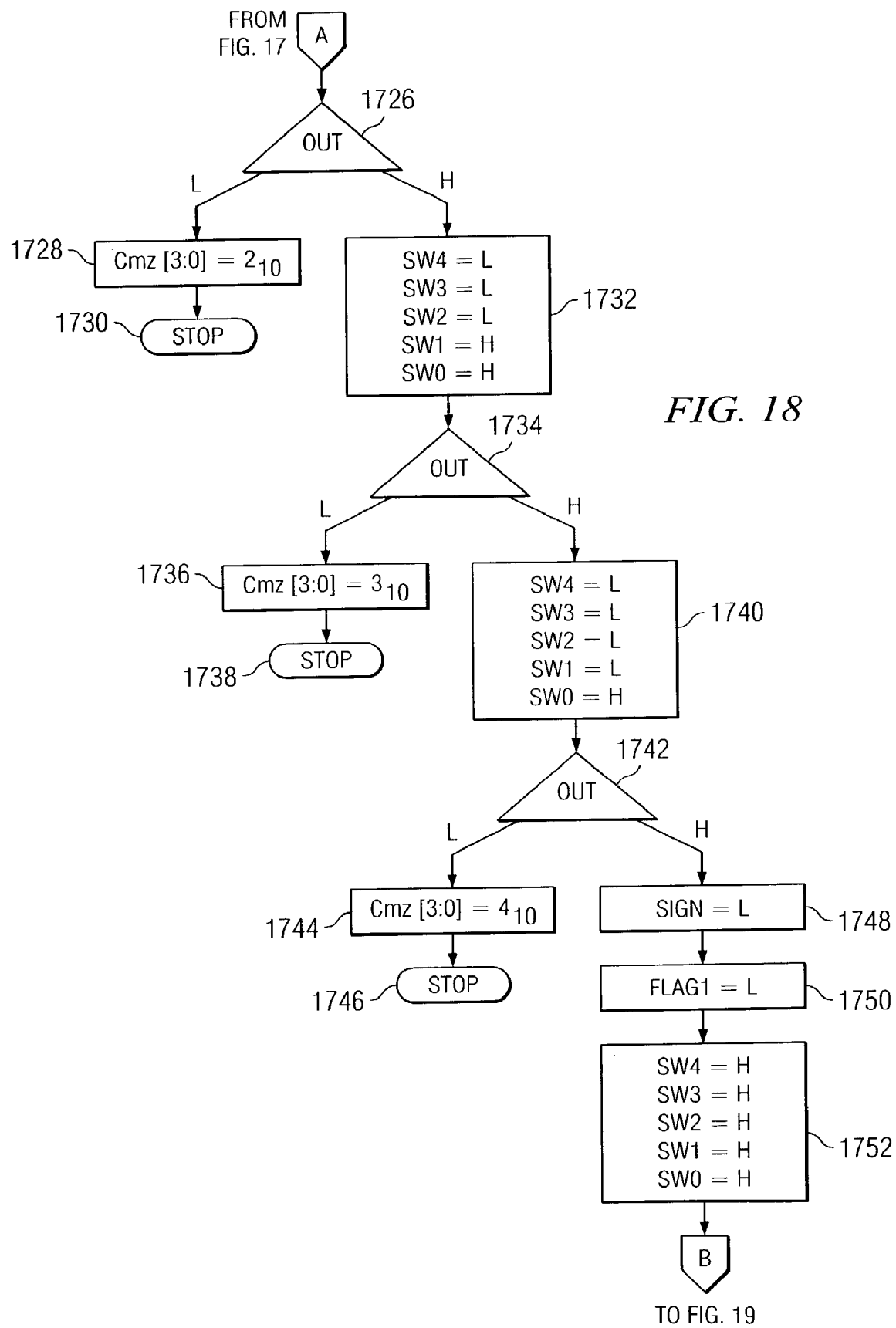

In FIG. 18, decision block 1726 determines if a toggle has occurred and, if so, the program flows along an "L" path to the function block 1728 to set the control word value to decimal "2," and then flows to a STOP block 1730. If the decision block 1726 determined that a toggle did not occur, the program flows along a "H" path to a function block 1732 in order to set the next switch value, SW[2], to a low logic state and then flows to a decision block 1734 to test the existence of a toggle. If a toggle occurs, the program proceeds along an "L" path to the function block 1736 to set the control word to a value of decimal "3" and then to a STOP block 1738. If the decision block 1734 determined that no toggle existed, the program would flow to a function block 1740 to set the value of SW[1] to a logic low state in addition to the previous switches, and then the program flows to a decision block 1742. Decision block 1742 determines if a toggle has occurred and, if so, the program flows to a function block 1744 to set the value of a control word to decimal "4" and then to a STOP block 1746. If the output has not toggled, the program will proceed along the "H" path to a function block 1748 to change the SIGN value to a logic low state and reset the flag to a low logic state, at the function block 1750. The program then proceeds to a function block 1752 to again set all of the switches to a logic high state and then to a decision block 1754 in FIG. 19 to test the toggle state.

Figure 19:
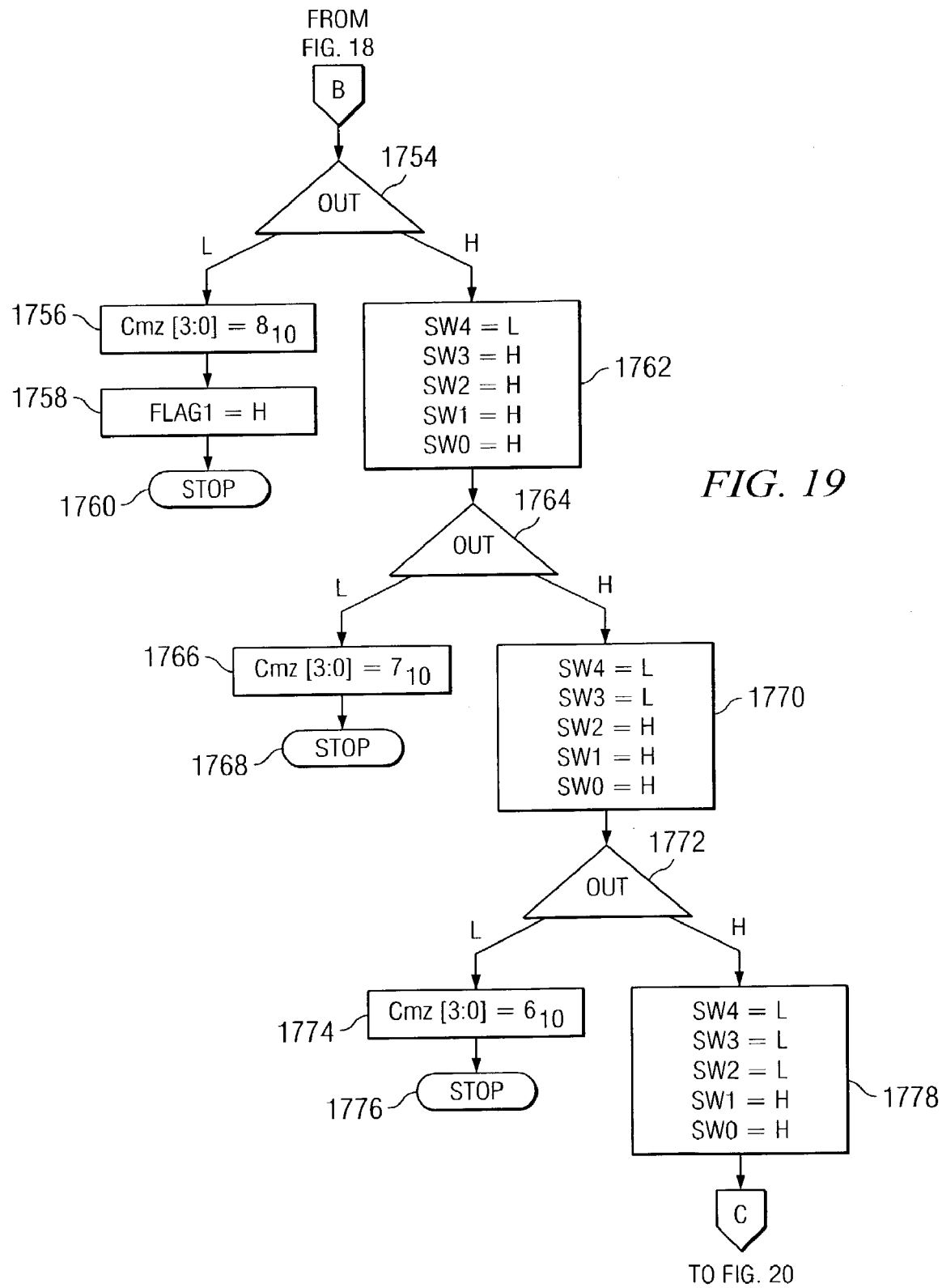
Figure 20:
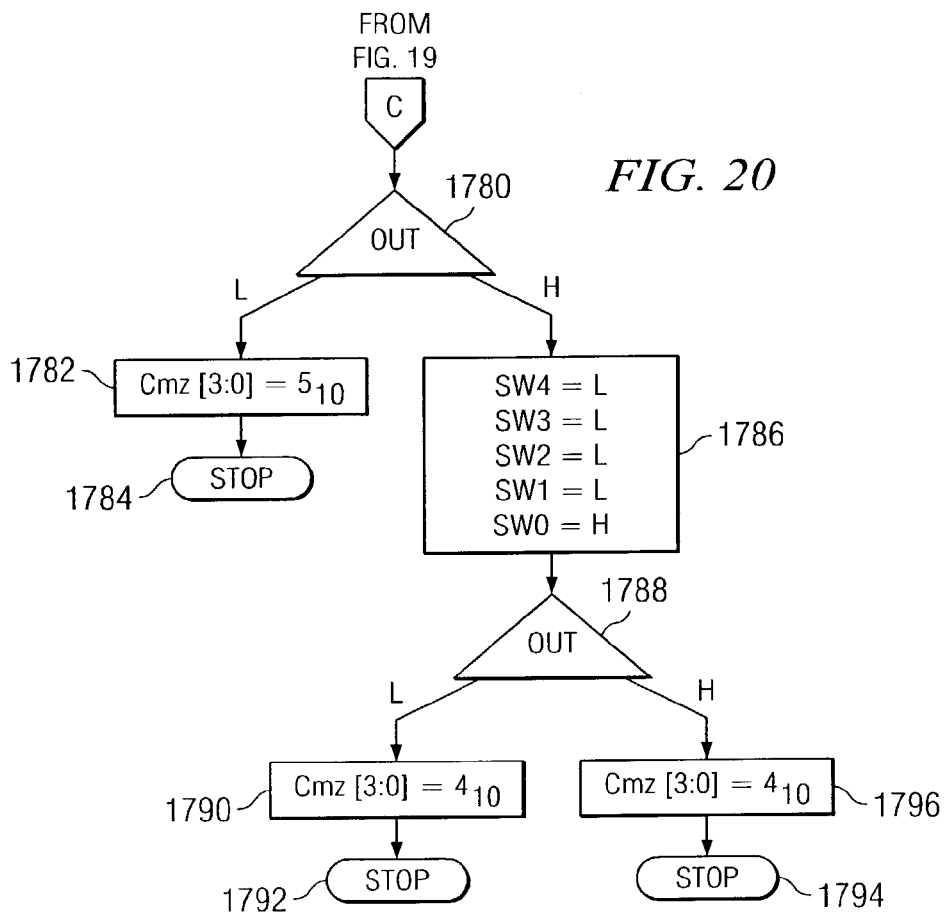

In FIG. 19, if it has toggled, this indicates an inability to calibrate and the program will flow to a function block 1756 to set the control word to the maximum value of decimal "8" to select the highest value of N. The program then flows to a function block 1758 to set the flag to a logic high state indicating the uncalibratable state and then to a STOP block 1760. If decision block 1754 determined that the output did not toggle, the program will flow to a function block 1762 in order to set the value of SW[4] to a low logic state and then to a decision block 1764 to determine if a toggle has occurred. If so, the program flows to a function block 1766 to set the control word to a value of decimal "7" and then to an STOP block 1768. If decision block 1764 determined that the output had not toggled, the program flows to a function block 1770 to set the value of SW[3] to a low logic state and then to a decision block 1772 for testing of the toggle state. If toggled, the program flows along a "L" path to a function block 1774 to set the control word to a value of decimal "6" and then to a STOP block 1776. The program flows from decision block 1772 on an "H" path to a function block 1778 if the output has not toggled in order to set the value of SW[2] to a low logic state, and then to a decision block 1780 in FIG. 20. Decision block 1780 determines if the output is toggled and, if so, the program flows along the "L" path to a function block 1782 in order to set the control word to a value of decimal "5" and then to an STOP block 1784. If the output has toggled, the program will flow along the "H" path to a function block 1786 to set the value of SW[1] equal to a low logic state and then to a decision block 1788. Decision block 1788 will flow to either a function block 1790 if a toggle has occurred to set the value of the control word to decimal "4" and then to a STOP block 1792 or to a function block 1796 if a toggle has not occurred to also set the control word to a value of decimal "4" and then to a stop block 1794.

Figure 21:
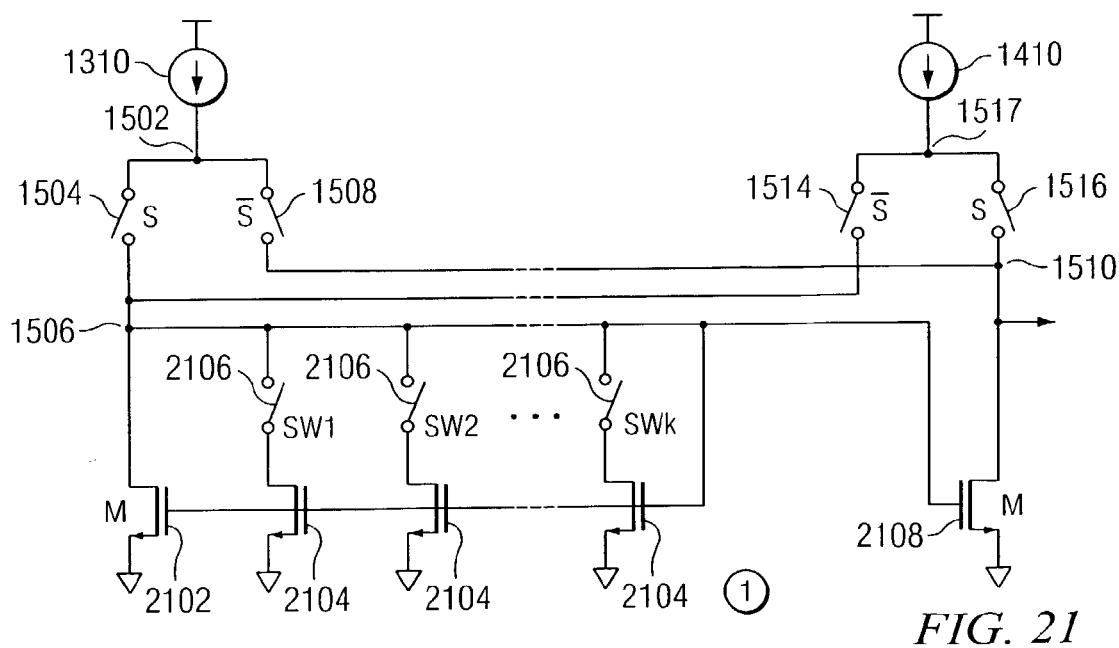
FIGS. 21–23 illustrate alternate embodiments of the embodiment of FIG. 15.
Figure 22:
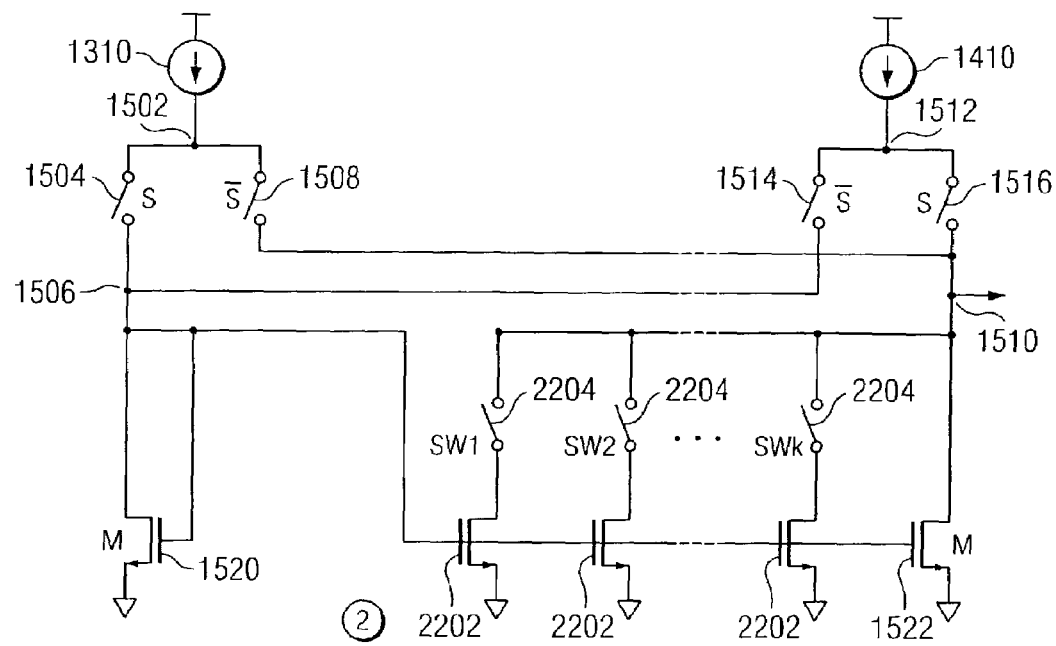
Figure 23:
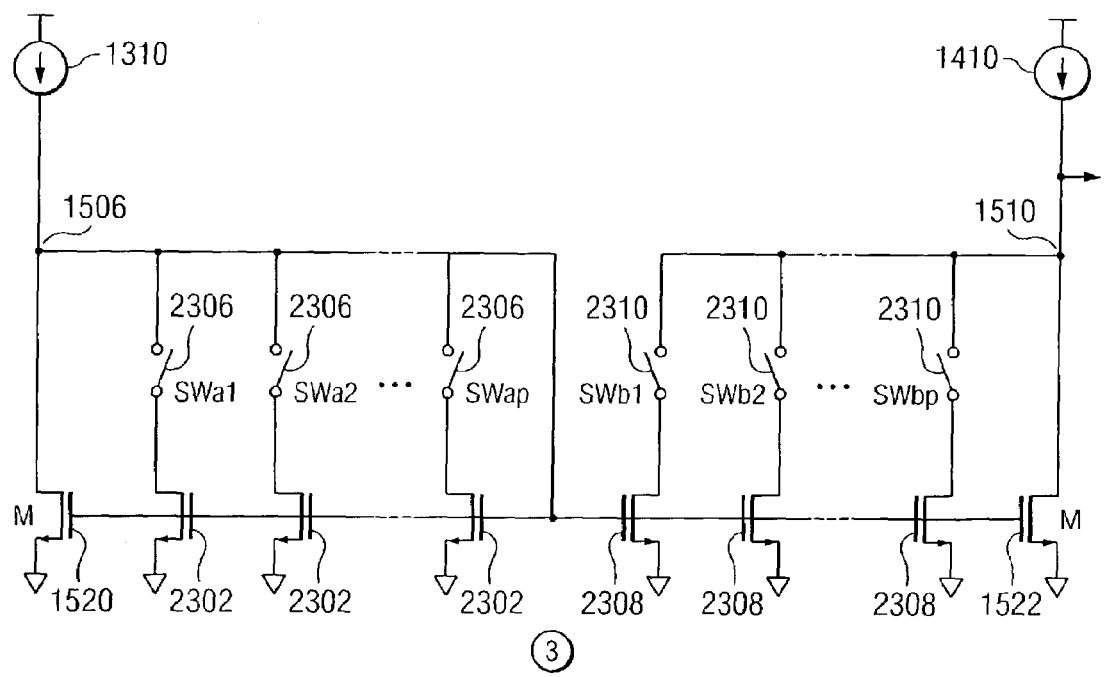

FIG. 22 illustrates a simplified diagram of the variable current mirror of FIG. 15 and FIGS. 21 and 23 illustrate alternate embodiments for the variable current mirror of FIG. 15. With specific reference to FIG. 21, there is provided connected to node 1506 an N-channel transistor 2102 having the source-drain path connected between node 1506 and ground and the gate thereof connected to the node 1506, transistor 2102 functionally equivalent to transistor 1520 of FIG. 15. There are provided a plurality of switch transistors 2104 that are disposed with the source-drain paths thereof in parallel with that of the transistor 2102 and each controlled by a switch 2106. Each of the switch transistors 2104 is controlled by signals SW[1], SW[2], ..., SW[k], and are functionally equivalent to the transistors 1536, 1538 and 1546 of FIG. 15. Node 1506 is connected to the gate of output drive transistor 2108, the source-drain path thereof connected between node 1510 and ground, transistor 2108 functionally equivalent to transistor 1522 of FIG. 15. Therefore, the current through transistor 2102 and any of the connected transistors 2104 will be mirrored to transistor 2108.

With specific reference to FIG. 22, a variation is provided wherein the switch transistors are comprised of a plurality of switch transistors 2202 disposed in parallel with the source-drain path of transistor 1522 between node 1510 and ground. Each of the switch transistors 2202 has a source-drain path thereof connected between ground and one side of a switch 2204, the other side thereof connected to node 1510. The control signals on switches 2204 range from SW[1], SW[2], ..., SW[k]. In this embodiment, the switch transistors 2202 effectively change the ratio of the transistor 1522 to that of 1520.

Referring now to FIG. 23, there is illustrated an embodiment wherein two sets of switch transistors are utilized. In this embodiment, the current source 1310 is connected directly to the node 1506 and current source 1410 is connected directly to node 1510. A plurality of switch transistors 2302 are connected in parallel with the source-drain path of transistor 1520, such that the gates thereof are connected to the node 1506 and the source-drain paths thereof are connected between ground and one side of a switch 2306, the other side thereof connected to node 1506. The switch control signals comprise SW[a1], SW[a2], ..., SW[ap]. Similarly, a plurality of switch transistors are connected such that the source-drain paths thereof are connected in parallel to the source-drain path of transistor 1522. The source-drain path of each of the transistors 2308 are connected between ground and one side of the switch 2310, the other side of switch 2310 connected to node 1510. The switches 2310 are controlled by signals SW[b1], SW[b2], ..., SW[bq]. In this embodiment, the mirrored current can have the ratio determined at both node 1506 and node 1510.

Although the preferred embodiment has been described in detail, it should be understood that various changes, substitutions and alterations can be made therein without departing from the spirit and scope of the invention as defined by the appended claims.

What is claimed is:

1. An integrated circuit amplifier, comprising:
   an internal amplifier having a first output coupled to a non-inverting input through an interface;
   said internal amplifier having a second output for providing an output signal of the integrated circuit with an associated output impedance;
   a series resistance element coupled between said first and second outputs;
   said internal amplifier including a first stage of amplification to provide current drive at said first output and through said interface, and a second stage of amplification to provide current drive at said second output through said series resistance element and said interface;
   said second stage of amplification comprising a transresistance device for driving said second output;
   said output impedance being a function of a ratio of a current drive of the first and second outputs and the value of said series resistance element;
   a voltage on said second output being a function of said interface and a current input to said internal amplifier; and
   wherein said transresistance device is comprised of a plurality of parallel transistors, each being selectable to allow for any combination of said parallel transistors to be combined to form said transresistance device, said configuration of said parallel transistors determined by an external calibration signal.

2. The amplifier of claim 1, wherein said internal amplifier is formed on a semiconductor substrate.

3. The amplifier of claim 2, wherein said series resistance element is formed on said semiconductor substrate.

4. The amplifier of claim 1, wherein said first stage of amplification comprises a first transistor having a first gain for driving said first output, a pre-amplifier for driving said first transistor, said pre-amplifier having a non-inverting input associated with the non-inverting input of said internal amplifier, said transresistance device driven by said pre-amplifier.

5. The amplifier of claim 1, wherein said second stage of amplification comprises a replica stage of amplification which drives said second output, which said replica stage of amplification provides a replica of the current through said first stage of amplification.

6. The amplifier of claim 5, wherein said first and second stages are comprised of transresistance devices.

7. The amplifier of claim 5, wherein said replica stage of amplification is variable, such that the ratio of said replica stage of amplification and said first stage of amplification is variable and determined by a control signal, which control signal thereby determines said output impedance.

8. The amplifier of claim 7, wherein said control signal comprises a calibration signal, and further comprising a calibration device for determining the value of said control signal as a calibration signal.

9. The amplifier of claim 8, wherein said calibration device and said internal amplifier are disposed on a semiconductor substrate and said series resistance element is also disposed on said semiconductor substrate.

10. The amplifier of claim 9, wherein said calibration device is operable to determine the value of said calibration signal to account for process variations in said series resistance element.

11. The amplifier of claim 10, wherein said calibration device includes:
a process independent reference device;
a process dependent reference device;
a comparator for comparing the operation of said process independent reference device relative to the operation of said process dependent reference device;
a correlation device for correlating the comparative operation of said process independent reference device and said process dependent reference device to the ratio of the drive currents provided at said first and second outputs, said correlation device determining the value of said calibration signal that will provide a desired output impedance.

12. The amplifier of claim 11, wherein said process independent reference device comprises a process independent current source and said process dependent reference device comprises a process dependent current source and said comparator is operable to compare the current difference between said process independent current source and said process dependent current source to a desired reference value and said correlation device is operable to correlate the determined difference to a calibration value necessary to account for process variations in said series resistance element by adjusting said replica stage of amplification to vary the ratio of the current drive of said first and second outputs.

13. The amplifier of claim 12, wherein said process dependent current source comprises a process independent voltage source for driving a process dependent resistive element that is dependent upon the process for fabricating said series resistance element and which is disposed upon said substrate, and a current minor for mirroring the current through said process dependent resistive element as the output of said process dependent current source.

14. The amplifier of claim 12, wherein said process independent current source comprises a process independent voltage source for driving a process independent resistive element that is independent of the process for fabricating said series resistance element and which is disposed external to said substrate, and a current minor for mirroring the current through said process independent resistive element as the output of said process independent current source.

15. The amplifier of claim 1, wherein the voltage at said first output is substantially independent of the ratio of the current drive of the first and second outputs.

16. The amplifier of claim 1, wherein said interface comprises a feedback resistor.

17. The amplifier of claim 16, wherein said feedback resistor is substantially larger than said series resistance element.

18. An integrated circuit amplifier, comprising:
an internal amplifier having a first output coupled to a non-inverting input through an interface;
said internal amplifier having a second output for providing an output signal of the integrated circuit with an associated output impedance;
a series resistance element coupled between said first and second outputs;
said output impedance a function of a ratio of a current drive of the first and second outputs and the value of said series resistance element;
a voltage on said second output being a function of said interface and the current input to said internal amplifier; and
further comprising a calibration device for calibrating the output impedance through calibration of the ratio of the current drive of the first and second outputs, wherein variation of the ratio of the current drive of the first and second outputs does not vary the voltage on said first output.

19. The amplifier of claim 18, wherein said calibration device and said internal amplifier are disposed on a semiconductor substrate and said series resistance element is also disposed on said semiconductor substrate.

20. The amplifier of claim 19, wherein said calibration device is operable to account for process variations in said series resistance element.

21. The amplifier of claim 20, wherein said calibration device includes:
a process independent reference device;
a process dependent reference device;
a comparator for comparing the operation of said process independent reference device relative to the operation of said process dependent reference device;
a correlation device for correlating the comparative operation of said process independent reference device and said process dependent reference device to the ratio of the drive currents is provided at said first and second outputs, said correlation device determining the value of said calibration device that will provide a desired output impedance.

22. The amplifier of claim 21, wherein said process independent reference device comprises a process independent current source and said process dependent reference device comprises a process dependent current source and said comparator is operable to compare the current difference between said process independent current source and said process dependent current source to a desired reference value and said correlation device is operable to correlate the determined difference to a calibration value necessary to account for process variations in said series resistance element by adjusting the ratio of the current drive of said first and second outputs.

23. The amplifier of claim 22, wherein said process dependent reference source comprises a process independent voltage source for driving a process dependent resistive element that is dependent upon the process for fabricating said series resistance element and which is disposed upon said substrate, and a current mirror for mirroring the current through said process dependent resistive element as the output of said process dependent current source.

24. The amplifier of claim 22, wherein said process independent reference source comprises a process independent voltage source for driving a process independent resistive element that is independent of the process for fabricating said series resistance element and which is disposed external to said substrate, and a current mirror for mirroring the current through said process independent resistive element as the output of said process independent current source.

25. A line driver for driving a transmission line having a line impedance associated therewith, comprising:
an internal amplifier having an output, and a non-inverting current input;
a first stage of amplification for driving a first output, said first output coupled to said non-inverting current input through an interface, said first stage of amplification driven by said internal amplifier;
a second stage of amplification for driving a second output to provide an output signal to the transmission line with an associated output impedance, said second stage of amplification a replica stage of said first stage of amplification and driven by said internal amplifier;

a series resistance element coupled between said first and second outputs;

said output impedance a function of the ratio of the current drive of the first and second stages of amplification to said non-inverting input and the value of said series resistance element; and a calibration engine for determining the value of said ratio required to change the value of said output impedance to substantially equal the line impedance and varying the parameters of at least one of said first and second stages of amplification to change said ratio to the determined ratio.

26. The line driver of claim 25, wherein the voltage on said second output is a function of said interface and the current input to said internal amplifier.

27. The line driver of claim 25, wherein said internal amplifier is formed on a semiconductor substrate.

28. The line driver of claim 27, wherein said series resistance element is formed on said semiconductor substrate.

29. The line driver of claim 25, wherein said first stage of amplification comprises a first transistor having a first gain for driving said first output, said internal amplifier driving said first transistor, said second stage of amplification comprising a transresistance device for driving said second output, said transresistance device driven by said internal amplifier.

30. The line driver of claim 29, wherein said transresistance device is comprised of a plurality of parallel transistors, each being selectable to allow for any combination of said parallel transistors to be combined to form said second transistor, said configuration of said parallel transistors determined by said calibration engine.

31. The line driver of claim 25, wherein said first and second stages of amplification are comprised of transresistance devices.

32. The line driver of claim 25, wherein said calibration engine and said internal amplifier are disposed on a semiconductor substrate and said series resistance element is also disposed on said semiconductor substrate.

33. The line driver of claim 32, wherein said calibration engine is operable to determine said ratio to account for process variations in said series resistance element that will cause said output impedance to vary from a value substantially equal to the line impedance.

34. The line driver of claim 33, wherein said calibration engine includes:

a process independent reference device;

a process dependent reference device;

a comparator for comparing the operation of said process independent reference device relative to the operation of said process dependent reference device;

a correlation device for correlating the comparative operation of said process independent reference device and said process dependent reference device to the ratio of the drive currents is provided at said first and second outputs, said correlation device determining the value of said ratio that will provide a desired output impedance to substantially equal the line impedance.

35. The line driver of claim 34, wherein said process independent reference device comprises a process independent current source and said process dependent reference device comprises a process dependent current source and said comparator is operable to compare the current difference between said process independent current source and said process dependent current source to a desired reference value and said correlation device is operable to correlate the determined difference to a calibration value necessary to account for process variations in said series resistance element by adjusting said second stage of amplification to vary the ratio of the current feedback of said first and second outputs.

36. The line driver of claim 35, wherein said process dependent current source comprises a process independent voltage source for driving a process dependent resistive element that is dependent upon the process for fabricating said series resistance element and which is disposed upon said substrate, and a current mirror for mirroring the current through said process dependent resistive element as the output of said process dependent current source.

37. The line driver of claim 35, wherein said process independent current source comprises a process independent voltage source for driving a process independent resistive element that is independent of the process for fabricating said series resistance element and which is disposed external to said substrate, and a current minor for mirroring the current through said process independent resistive element as the output of said process independent current source.

38. A method for amplifying an input signal in an integrated circuit, comprising:

coupling a first output of an internal amplifier to a non-inverting input thereof through an interface;

coupling a second output of the internal amplifier through a series resistance element to the first output to provide an output signal of the integrated circuit with an associated output impedance;

the output impedance being a function of a ratio of a current drive of the first and second outputs and the value of the series resistance element;

a voltage on the second output being a function of the interface and a current input to the internal amplifier;

wherein coupling the first output comprises driving a first node with a first stage of amplification to provide current drive at the first node and coupling the first node through the interface to the non-inverting input, and coupling the second output comprises driving a second node with a second stage of amplification, the second node connected to the first node through the series resistance element to provide current drive at the second node through the series resistance element and the interface;

with driving the second node with the second stage of amplification comprising driving the second node with a transresistance device; and wherein driving the second node with the transresistance device is comprises driving the second node with a plurality of parallel transistors, each being selectable to allow for any combination of the parallel transistors to be combined to form the transresistance device, the configuration of the parallel transistors determined by an external calibration signal.

39. The method of claim 38, wherein driving the first node with a first stage of amplification comprises driving the first node with a first transistor having a first gain, which first transistor is driven by a pre-amplifier, the pre-amplifier having a non-inverting input associated with the non-inverting input of the internal amplifier.

40. The method of claim 38, wherein the voltage at the first output is substantially independent of the ratio of the current drive of the first and second outputs.

41. The method of claim 38, wherein the interface comprises a feedback resistor.

42. The method of claim 41, wherein the feedback resistor is substantially larger than the series resistance element.

43. A method for amplifying an input signal in an integrated circuit, comprising:
  coupling a first output of an internal amplifier to a non-inverting input thereof through an interface;
  coupling a second output of the internal amplifier through a series resistance element to the first output to provide an output signal from the integrated circuit with an associated output impedance;
  the output impedance a function of a ratio of a current drive of the first and second outputs and the value of the series resistance element;
  a voltage on the second output being a function of the interface and the current input to the internal amplifier wherein coupling the first output comprises driving a first node with a first stage of amplification to provide current drive at the first node and coupling the first node through the interface to the non-inverting input, and coupling the second output comprises driving a second node with a second stage of amplification, the second node connected to the first node through the series resistance element to provide current drive at the second node through the series resistance element and the interface; wherein driving the second node with the second stage of amplification comprises driving the second node with a replica stage of amplification, which replica stage of amplification provides a replica of the current through the first stage of amplification.

44. The method of claim 43, wherein the first and second stages of amplification are comprised of transresistance devices.

45. The method of claim 43, wherein the replica stage of amplification is variable, and further comprising varying the ratio of the replica stage of amplification and the first stage of amplification by generating a control signal that determines the ratio, which control signal thereby determines the output impedance.

46. The method of claim 45, wherein the control signal comprises a calibration signal, and further comprising determining the value of the control signal as a calibration signal with a calibration device.

47. The method of claim 46, wherein the calibration device and the internal amplifier are disposed on a semiconductor substrate and the series resistance element is also disposed on the semiconductor substrate.

48. The method of claim 47, wherein determining the value of the control signal as a calibration signal with the calibration device comprises determining the value of the calibration signal with the calibration device to account for process variations in the series resistance element.

49. The method of claim 48, wherein determining the value of the calibration signal with the calibration device includes
  generating a process independent reference parameter with a process independent reference device;
  generating a process dependent reference parameter with a process dependent reference device;
  comparing the operation of the process independent reference device relative to the operation of the process dependent reference device;
  correlating the comparative operation of the process independent reference device and the process dependent reference device to the ratio of the drive currents provided at the first and second outputs, the step of correlating determining the value of the calibration signal that will provide a desired output impedance.

50. The method of claim 49, wherein generating a process independent reference parameter with process independent reference device comprises generating a process independent reference parameter with a process independent current source, and generating a process dependent reference parameter with the process dependent reference device comprises generating a process dependent reference parameter with a process dependent current source and the step of comparing is operable to compare the current difference between the process independent current source and the process dependent current source to a desired reference value and the correlation device is operable to correlate the determined difference to a calibration value necessary to account for process variations in the series resistance element by adjusting the replica stage of amplification to vary the ratio of the current drive of the first and second outputs.

51. The method of claim 50, wherein generating a process dependent reference parameter with a process dependent current source comprises:
  providing a process independent voltage source:
  driving a process dependent resistive element with the process dependent resistive element, which process dependent resistive element is dependent upon the process for fabricating the series resistance element and which is disposed upon the substrate; and
  mirroring the current through the process dependent resistive element as the output of the process dependent current source.

52. The method of claim 50, wherein generating a process independent reference parameter with a process independent current source comprises:
  providing a process independent voltage source:
  driving a process independent resistive element that is independent of the process for fabricating the series resistance element and which is disposed external to the substrate; and
  mirroring the current through the process independent resistive element as the output of the process independent current source.

53. A method for amplifying an input signal in an integrated circuit, comprising:
  coupling a first output of an internal amplifier to a non-inverting input thereof through an interface;
  coupling a second output of the internal amplifier through a series resistance element to the first output to provide an output signal of the integrated circuit with an associated output impedance;
  the output impedance a function of a ratio of a current drive of a first and second outputs and the value of the series resistance element; and
  a voltage on the second output being a function of the interface and the current input to the internal amplifier and further comprising calibrating the output impedance with a calibration device through calibration of the ratio of the current drive of the first and second outputs, wherein variation of the ratio of the current drive of the first and second outputs does not vary the voltage on the first output.

54. The method of claim 53, wherein the calibration device and the internal amplifier are disposed on a semiconductor substrate and the series resistance element is also disposed on the semiconductor substrate.

55. The method of claim 54, wherein calibrating the output impedance with the calibration device is operable to account for process variations in the series resistance element.

56. The method of claim 55, wherein calibrating the output impedance with the calibration device includes:

generating a process independent reference parameter with a process independent reference device;
generating a process dependent reference parameter with a process dependent reference device;
comparing the operation of the process independent reference device relative to the operation of the process dependent reference device;
correlating the comparative operation of the process independent reference device and the process dependent reference device to the ratio of the drive currents is provided at the first and second outputs, the step of correlating determining the value of the calibration device that will provide a desired output impedance.

57. The method of claim 56, wherein the process independent reference device comprises a process independent current source and the process dependent reference device comprises a process dependent current source and the step of comparing is operable to compare the current difference between the process independent current source and the process dependent current source to a desired reference value and the step of correlating is operable to correlate the determined difference to a calibration value necessary to account for process variations in the series resistance element by adjusting the ratio of the current drive of the first and second outputs.

58. The method of claim 57, wherein generating the process dependent reference parameter with a process dependent current source comprises:
providing a process independent voltage source;
driving a process dependent resistive element with the process independent voltage source, which process dependent resistive element is dependent upon the process for fabricating the series resistance element and which is disposed upon the substrate; and
mirroring the current through the process dependent resistive element as the output of the process dependent current source.

59. The method of claim 57, wherein generating the process independent reference parameter with process independent reference source comprises:
providing a process independent voltage source;
driving a process independent resistive element with the process independent voltage source, which process independent resistive element that is independent of the process for fabricating the series resistance element and which is disposed external to the substrate; and
mirroring the current through the process independent resistive element as the output of the process independent current source.

60. A method for driving a transmission line having a line impedance associated therewith, comprising the steps of:
providing an internal amplifier having an output, and a non-inverting current input;
driving a first output with a first stage of amplification, the first output coupled to the non-inverting current input through an interface, the first stage of amplification driven by the internal amplifier;
driving a second output with a second stage of amplification to provide an output signal to the transmission line with an associated output impedance, the second stage of amplification a replica stage of the first stage of amplification and driven by the internal amplifier;
coupling the first and second outputs with a series resistance element disposed therebetween;
the output impedance a function of a ratio of a current drive of the first and second stages of amplification to the non-inverting input and the value of the series resistance element; and
determining with a calibration engine the value of the ratio required to change the value of the output impedance to substantially equal the line impedance and varying the parameters of at least one of the first and second stages of amplification to change the ratio to the determined ratio.

61. The method of claim 60, wherein the voltage on the second output is a function of the interface and the current input to the internal amplifier.

62. The method of claim 60, wherein the step of providing the internal amplifier comprises forming the internal amplifier on a semiconductor substrate.

63. The method of claim 62, wherein the series resistance element is formed on the semiconductor substrate.

64. The method of claim 60, wherein the step of driving the first output with a first stage of amplification comprises the step of driving the first output with a first transistor having a first gain, the internal amplifier driving the first transistor, the step of driving the second output with the second stage of amplification comprising the step of driving the second output with a transresistance device, the transresistance device driven by the internal amplifier.

65. The method of claim 64, wherein the transresistance device is comprised of a plurality of parallel transistors, each being selectable to allow for any combination of the parallel transistors to be combined to form the second transistor, the configuration of the parallel transistors determined by the step of determining with the calibration engine.

66. The method of claim 60, wherein the first and second stages of amplification are comprised of transresistance devices.

67. The method of claim 60, wherein the calibration engine and the internal amplifier are disposed on a semiconductor substrate and the series resistance element is also disposed on the semiconductor substrate.

68. The method of claim 67, wherein the step of determining with the calibration engine is operable to determine the ratio to account for process variations in the series resistance element that will cause the output impedance to vary from a value substantially equal to the line impedance.

69. The method of claim 68, wherein the step of determining with the calibration engine includes the steps of:
generating a process independent reference parameter with a process independent reference device;
generating a process dependent reference parameter with a process dependent reference device;
comparing the operation of the process independent reference device relative to the operation of the process dependent reference device; and
correlating the comparative operation of the process independent reference device and the process dependent reference device to the ratio of the drive currents is provided at the first and second outputs, the step of correlating determining the value of the ratio that will provide a desired output impedance to substantially equal the line impedance.

70. The method of claim 69, wherein the step of generating the process independent reference parameter with the process independent reference device comprises generating the process independent reference parameter with a process independent current source and step of generating the process dependent reference parameter with the process dependent reference device comprises generating the process dependent reference parameter with a process dependent current source and the step of comparing is operable to compare the current difference between the process independent current source and the process dependent current source to a desired reference value and the step of correlating is operable to correlate the determined difference to a calibration value necessary to account for process variations in the series resistance element by adjusting the second stage of amplification to vary the ratio of the current drive of the first and second outputs.

71. The method of claim 70, wherein the step of generating the process dependent parameter with the process dependent current source comprises the steps of:
generating a process independent voltage source;
driving a process dependent resistive element with the process independent voltage source, which process dependent resistive element is dependent upon the process for fabricating the series resistance element and which is disposed upon the substrate; and
mirroring the current through the process dependent resistive element as the output of the process dependent current source.

72. The method of claim 70, wherein the generating a process independent reference parameter with the process independent current source comprises the steps of:
generating a process independent voltage source:
driving a process independent resistive element with the process independent voltage source, which process independent resistive element is independent of the process for fabricating the series resistance element and which is disposed external to the substrate, and a current minor for mirroring the current through the process independent resistive element as the output of the process independent current source.

73. A calibration system for calibrating an output impedance of a line driver to match the impedance of a transmission line, which line driver has an internal amplifier with a first output at a first gain fed back to an input thereof through an interface device and a second output with a second gain that is a replica of the first gain with a series resistance element connected between the first and second outputs, and wherein the output impedance of the line driver is a function of a ratio of a current drive at the first and second outputs, comprising:
a calibration device for determining as a calibration value the ratio of the current drive at the first and second outputs that will provide an output impedance from the line driver that will substantially match the transmission line impedance; and
means for varying the ratio of the current drive at the first and second outputs in accordance with the calibration value.

74. The calibration system of claim 73, wherein the internal amplifier includes a first stage of amplification to provide current drive at the first output and through the interface, and a second stage of amplification to provide current drive at the second output through the series resistance element and the interface, the second stage of amplification comprising a replica stage of amplification which drives the second output, which replica stage of amplification provides a replica of the current through the first stage of amplification, and said means for varying the ratio comprises means for varying the ratio of the gains of the replica stage of amplification and the first stage of amplification.

75. The calibration system of claim 74, wherein the replica stage of amplification is variable and said means for varying the ratio comprises means for varying the replica stage of amplification.

76. The calibration system of claim 75, wherein said calibration device and the internal amplifier are disposed on a semiconductor substrate and the series resistance element is also disposed on said semiconductor substrate.

77. The calibration system of claim 76, wherein said calibration device is operable to determine said calibration signal to account for process variations in said series resistance element.

78. The amplifier of claim 77, wherein said calibration device includes:
a process independent reference device;
a process dependent reference device;
a comparator for comparing the operation of said process independent reference device relative to the operation of said process dependent reference device;
a correlation device for correlating the comparative operation of said process independent reference device and said process dependent reference device to the ratio of the drive currents provided at said first and second outputs, said correlation device determining the magnitude of said calibration value that will provide a desired output impedance.

79. The amplifier of claim 78, wherein said process independent reference device comprises a process independent current source and said process dependent reference device comprises a process dependent current source and said comparator is operable to compare the current difference between said process independent current source and said process dependent current source to a desired reference value and said correlation device is operable to correlate the determined difference to a magnitude of said calibration value necessary to account for process variations in said series resistance element by adjusting the replica stage of amplification to vary the ratio of the current drive of the first and second outputs.

80. The amplifier of claim 79, wherein said process dependent current source comprises a process independent voltage source for driving a process dependent resistive element that is dependent upon the process for fabricating the series resistance element and which is disposed upon said substrate, and a current mirror for mirroring the current through said process dependent resistive element as the output of said process dependent current source.

81. The amplifier of claim 79, wherein said process independent current source comprises a process independent voltage source for driving a process independent resistive element that is independent of the process for fabricating the series resistance element and which is disposed external to said substrate, and a current mirror for mirroring the current through said process independent resistive element as the output of said process independent current source.

* * * * *